United States Patent
Parikh et al.

(10) Patent No.: US 11,973,519 B2
(45) Date of Patent: Apr. 30, 2024

(54) NORMALIZED PROBABILITY DETERMINATION FOR CHARACTER ENCODING

(71) Applicant: Intel Corporation, Santa Clara, CA (US)

(72) Inventors: Bhushan G. Parikh, Chandler, AZ (US); Stephen T. Palermo, Chandler, AZ (US)

(73) Assignee: Intel Corporation, Santa Clara, CA (US)

( * ) Notice: Subject to any disclaimer, the term of this patent is extended or adjusted under 35 U.S.C. 154(b) by 799 days.

(21) Appl. No.: 16/909,640

(22) Filed: Jun. 23, 2020

(65) Prior Publication Data
US 2020/0326910 A1 Oct. 15, 2020

(51) Int. Cl.
*H03M 7/30* (2006.01)
*G06F 17/18* (2006.01)

(52) U.S. Cl.
CPC .......... *H03M 7/3097* (2013.01); *G06F 17/18* (2013.01); *H03M 7/3084* (2013.01)

(58) Field of Classification Search
CPC .... H03M 7/30; H03M 7/3084; H03M 7/3097; G06F 17/18
See application file for complete search history.

(56) References Cited

U.S. PATENT DOCUMENTS

| 5,282,153 | A | * | 1/1994 | Bartkowiak | G06F 7/57 708/209 |
| 5,867,114 | A | * | 2/1999 | Barbir | H03M 7/4006 341/67 |
| 2019/0268017 | A1 | * | 8/2019 | Gopal | H04L 1/0057 |
| 2021/0127294 | A1 | * | 4/2021 | Kwak | H04W 28/0205 |

OTHER PUBLICATIONS

André Weißenberger and Bertil Schmidt, "Massively Parallel Huffman Decoding on GPUs", In Proceedings of the 47th International Conference on Parallel Processing (ICPP '18), Article 27, pp. 1-10, 2018 (Year: 2018).*

(Continued)

*Primary Examiner* — Matthew D Sandifer
(74) *Attorney, Agent, or Firm* — Compass IP Law PC

(57) ABSTRACT

Examples described herein relate to an apparatus comprising a central processing unit (CPU) and an encoding accelerator coupled to the CPU, the encoding accelerator comprising an entropy encoder to determine normalized probability of occurrence of a symbol in a set of characters using a normalized probability approximation circuitry, wherein the normalized probability approximation circuitry is to output the normalized probability of occurrence of a symbol in a set of characters for lossless compression. In some examples, the normalized probability approximation circuitry includes a shifter, adder, subtractor, or a comparator. In some examples, the normalized probability approximation circuitry is to determine normalized probability by performance of non-power of 2 division without computation by a Floating Point Unit (FPU). In some examples, the normalized probability approximation circuitry is to round the normalized probability to a decimal.

18 Claims, 12 Drawing Sheets

(56) References Cited

OTHER PUBLICATIONS

Collet, Yann, and Murray Kucherawy, "Zstandard Compression and the application/zstd Media Type", No. rfc8478, 2018 (Year: 2018).*

Dutta, Sumit, "Floating-point Unit (FPU) Designs with Nano-electromechanical (NEM) Relays", © 2013 Massachusetts Institute of Technology, Aug. 29, 2013, 74 pages.

O'Neil, Molly A., et al., "Floating-Point Data Compression at 75 Gb/s on a GPU", Copyright 2011 ACM, Mar. 5, 2011, 7 pages.

Published Application 20200326910, Filed Jun. 23, 2020, Figure 1 (Prior Art—2019) with description, 2 pages.

* cited by examiner

NORMALIZED PROBABILITY DETERMINATION FOR CHARACTER ENCODING

Data compression schemes seek to reduce the size of data using various methods including reducing the data redundancy in messages, improving data coding, and data approximation methods. An objective of data compression is to reduce the amount of data required to store and/or transmit digital content. Data compression is widely used to help Cloud and Communication Service Providers (CoSPs and CSPs) reduce network bandwidth and reduce an amount of storage used to store data. Reducing network bandwidth enables CoSPs to offer more capable 5G mobile services that consume more bandwidth and resources than existing 4G/LTE based services at similar cost. Network bandwidth reductions apply not only to terrestrial based networks but also to satellite based constellations, especially Lower Earth Orbit networks that are responding to latency sensitive requests. Service providers benefit directly from data compression as service providers do not pass infrastructure costs directly to customers. Data compression thus has a direct net operation expense benefit for CoSPs and CSPs.

Various compression algorithms use different encoding techniques such as statistical encoding methods (e.g., Huffman Coding, Arithmetic Encoding, or Finite State Entropy/Asymmetric numeral systems (ANS)), Run Length Encoding, and Dictionary Encoding (e.g., Lempel Ziv encoding schemes (e.g., LZ77, LZ78, LZ4, and LZ4s)). Lossless encoding standards are especially critical for Service Providers that provide digital communications and storage capabilities that guarantee service levels of data integrity either for data in motion or at rest and recovered in the future.

DETAILED DESCRIPTION

Figure 1:
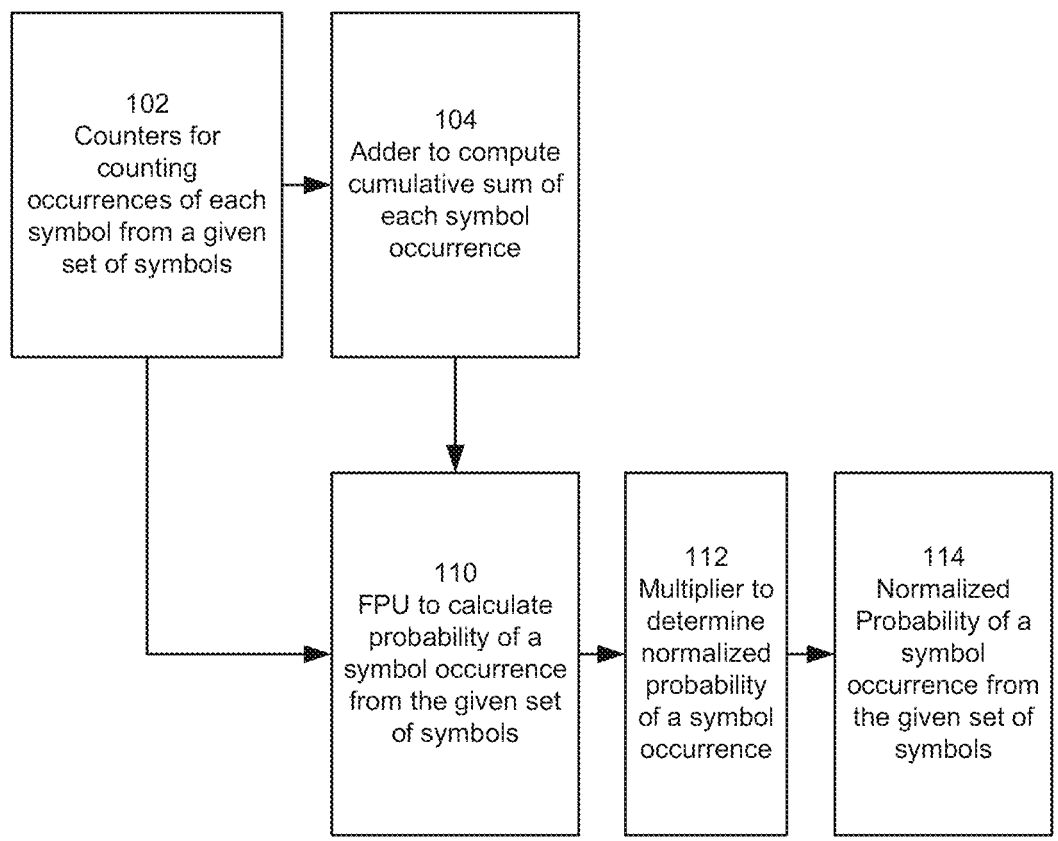
FIG. 1 depicts an example flow of computing normalized probability of a symbol from the given set of symbols.

Lossless compression schemes attempt to reconstruct an original message exactly from a compressed representation of a message. Lossless data compression can include a pre-processing stage, a search stage that transforms the input data by replace repeated patterns, a probability step that identifies high-frequency input data patterns, and an entropy encoding stage that uses the probability information to code the input data to produce the compressed output.

Dynamic probability models such as the Lempel-Ziv (LZ) algorithm are an example of a probability model that dynamically builds a pattern dictionary as it incrementally encounters input data. The pattern dictionary can be dynamically rebuilt when the data is decompressed so no additional data can be transmitted to describe the dictionary that goes along with the compressed data. The LZ family includes compressions standards such as gzip and gif. These dictionary-based algorithms make no assumptions about the type of the input data so they are flexible enough to support just about any type of file or message including text, images, or video.

LZ encoders can compress input data utilizing prior input data information of the input data stream known as the history. In general, LZ encoders can search the history for a string that matches each next portion of the input data stream. If such a match is found, the LZ encoder encodes the matched next portion of the input data using a reference (offset and length) to the matching string in the history. Otherwise, the LZ encoder encodes a next character of the input data stream as a raw data code or literal that designates the character as plain text. Use of the last or most recent encoded portion of the input data stream is then added to the history and will be included in the search to match the next portion of the input data stream. In some cases, the history can be stored in a fixed sized, sliding window type history store, from which the oldest data exits as new data from the input data stream is added. Accordingly, with these prior LZ encoders, an input data stream can be encoded with respect to preceding data in that same input data stream. LZ encoders can achieve compression of the input data stream because the match codes can be much smaller than the substrings that they represent.

An entropy encoder can be used to encode repeated patterns in LZ encoded stream with a minimum number of bits to achieve entropy closest to a theoretical limit of Shannon entropy. Huffman Coding encoding can be used for lossless compression schemes and may have computational advantages over other schemes such as Arithmetic Coding. Zstandard (zstd or ZSTD) can use a form of entropy encoding called Finite State Entropy (FSE) and can be much faster than normal Arithmetic Coding yet achieve a measure of entropy very close to Shannon entropy and can achieve a better compression ratio than that of Huffman Coding. The encoding stage for Zstandard can encode input data based on a Normalized Probability (NP) of given input symbol.

FIG. 1 depicts an example of computing Normalized Probability of a symbol occurrence from the given set of symbols. At 102, counters count total occurrences of each symbol from the given set of symbols. At 104, an adder can compute cumulative sum of all occurrences of each symbol from the given set of symbols. At 110, a Floating Point Unit (FPU) circuitry can calculate probability of each symbol. Since this computation requires non-powers of 2 divisions, an FPU circuitry (e.g., on a CPU die) is used to calculate these divisions. A CPU die can include a CPU and other semiconductor devices that compose one or more processing devices or another circuitry. For example, a physical CPU package can include one or more dies, plastic or ceramic housing for the dies, and conductive contacts that conductively coupled to a circuit board. At 112, a multiplier can determine a Normalized Probability of occurrence of a given symbol. At 114, Normalized Probability of a symbol occurrence from the given set of symbols is ready for further computations.

Figure 2:
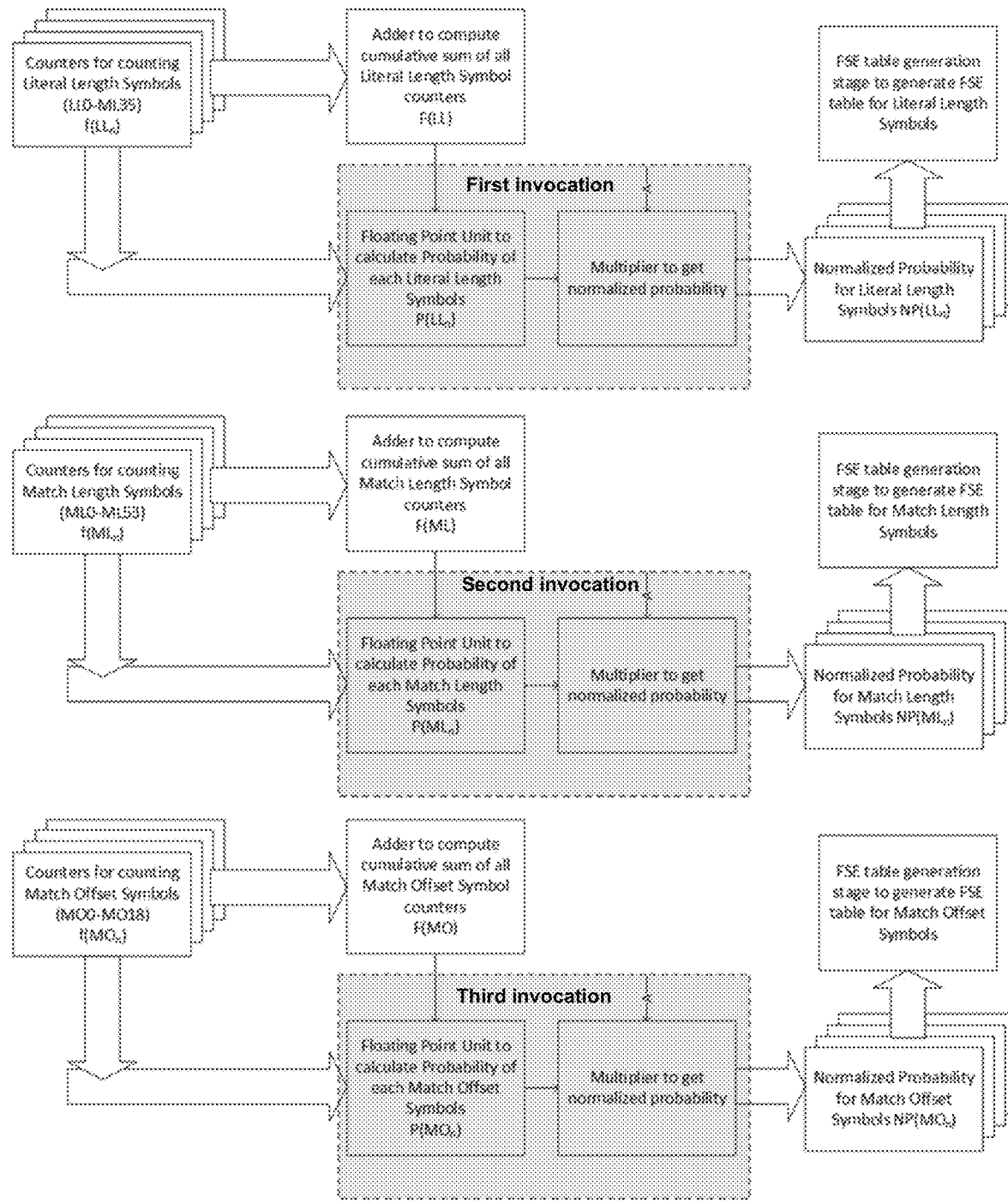
FIG. 2 depicts an example flow of FSE table generation portion for ZSTD sequence symbols.

FIG. 2 depicts an example flow of FSE table generation portion for compressing ZSTD sequence payload which is consist of three symbols: (1) literal length symbol; (2) match length symbol; and (3) match offset symbol. Literal length symbol represents number of literal to be copied directly from literal section. Match length and Match Offset symbols together represent a copy command, which specifies location (Match Offset) and number of symbols (Match Length) to be copied from previously stored history. For an example description of ZSTD, see Internet Engineering Task Force (IETF) RFC 8478 "Zstandard Compression and the application/zstd Media Type" (October 2018) ("ZSTD specification").

As shown, the FSE table generation requires computing Normalized Probability of literal length symbol occurrence (NP(LL$_n$)), Normalized Probability of match length symbol occurrence NP(ML$_n$) and Normalized Probability of match offset symbol occurrence (NP(MO$_n$)). In particular, an FPU followed by a multiplier is used to calculate these Normalized Probabilities. Such computations can require use of complex processor instructions involving Floating Point Unit (FPU) since the division can be a non-power of 2. As shown, three FPU invocations are used to achieve acceptable throughput to calculate NPs of literal length symbol occurrence, match length symbol occurrence, and match offset symbol occurrence. An example of how normalized probability of sequence symbol occurrence can be used to build an FSE table is described with respect to RFC 8478: section 4.1.1 FSE Table Description.

Zstandard compression, which is based on Finite State Entropy encoding, requires computation of a probability of sequences characters, symbols, or alphabets normalized over a number A, which can be an accuracy log (where A=$2^x$, x>0). An example of determination of Normalized Probability is described next. In this example, $f_n$ can represent occurrence of any symbol "$s_n$" in a given data set (n>0). A probability of a symbol $s_n$ occurring can be represented as follows:

$$P(s_n) = f_n/F \text{ where } F = \Sigma_{k=0}^n f_k$$

The Normalized Probability over accuracy log A can be represented as $$NP(s_n) = (f_n * A)/F$$

$$S_{NP} = \Sigma_{k=0}^n NP(s_k) == A$$

An example of generated Normalized Probability (NP) over accuracy log of 256, for symbols a-e is as follows.

| $s_n$ | f ($s_n$) | F | P ($s_n$) | NP ($s_n$) | NP ($S_n$) (Integer) |
|---|---|---|---|---|---|
| a | 10 | 160 | 0.0625 | 16 | 16 |
| b | 21 | | 0.13125 | 33.6 | 34 |
| c | 32 | | 0.2 | 51.2 | 51 |
| d | 43 | | 0.2685 | 68.8 | 69 |
| e | 54 | | 0.3375 | 86.4 | 86 |

Various embodiments can compute normalized probability without use of an FPU or a divider unit by providing an approximation of normalized probability for an FSE encoder. The probability approximation can represent a rounding up or rounding down of normalized probability to a nearest decimal (e.g., 0, 0.25, 0.5, or 0.75), or other decimals (e.g., 0, 0.2, 0.4, 0.6, or 0.8) and so forth. In some examples, normalized probability approximation can be 99.9% accurate to values calculated by an FPU and comply with Zstandard specification requirements for normalized probability accuracy to achieve "lossless" compression in accordance with the ZSTD specification.

Various embodiments can reduce circuitry and power used to determine normalized probability. Various embodiments can calculate non-power of 2s divisions without a dedicated divider circuit. Non-power of 2s division can refer to division where a denominator is not a power of 2 (e.g., 5, 7, 17, 29, etc.). Various embodiments generate an approximation of normalized probability for a given data set using basic arithmetic components (e.g., one or more adders, one or more subtractors, one or more shifters, and/or one or more comparators). Various embodiments can help simplify hardware design both in terms of silicon area space (e.g., less circuitry) used for an encoder. In some examples, an FPU is not needed or used by an encoder to determine normalized probability. An absence of circuitry for an FPU can allow a system to fit in a smaller silicon die as a single chip on a motherboard or integrated into a CPU or network interface for cloud networking, cloud native operation to compress/decompress data traffic before encryption.

However, various embodiments permit use of an FPU for normalized probability approximation. In some examples, normalized probability approximation can be turned-on or turned-off by use of a driver and/or operating system.

Various embodiments can be used in connection with compression, machine learning techniques like image recognition, pattern matching or detection or any technique that depends on prediction of occurrence of a character or symbol pattern.

Figure 3:
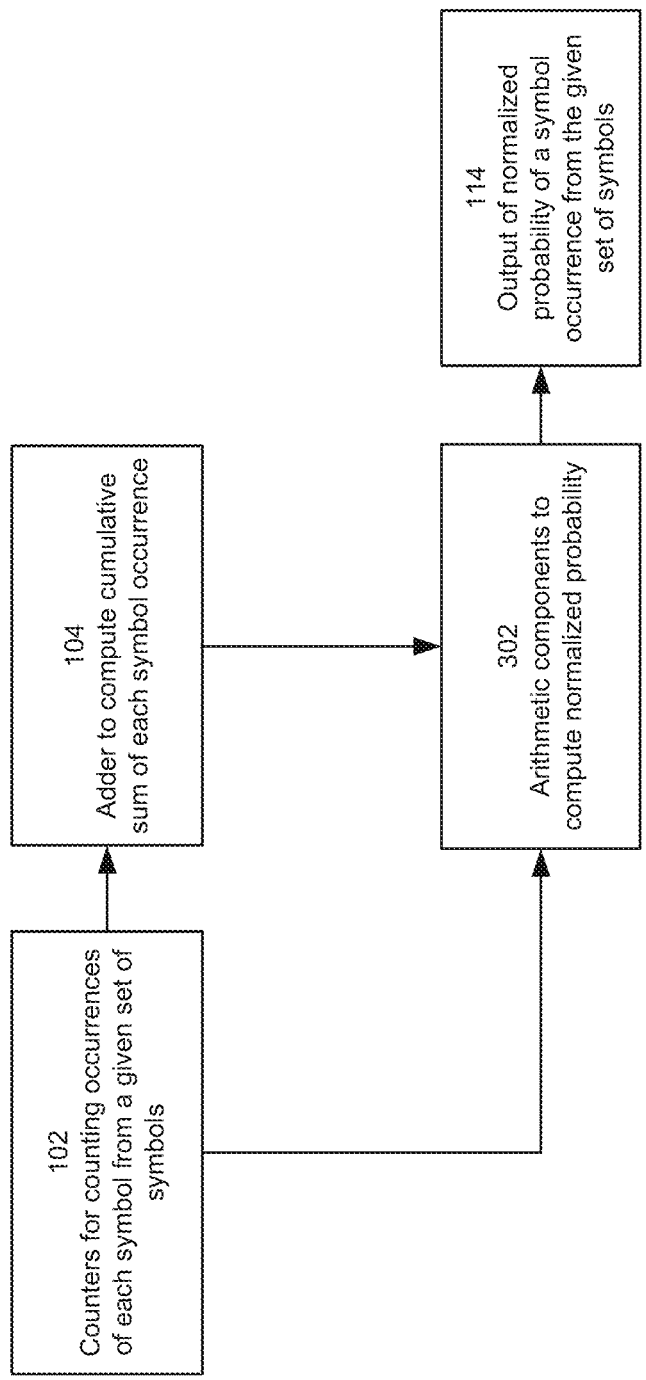
FIG. 3 depicts an example flow of computing normalized probability of a symbol from the given set of symbols in accordance with various embodiments.

FIG. 3 depicts an example flow in accordance with various embodiments. Actions 102, 104, and 114 are substantially similar to those described with respect to FIG. 1. In some examples, counters for counting symbols, adders to compute cumulative sum of symbol counters can be used to perform 102 and 104. However, at 302, basic arithmetic components (e.g., one or more adders, one or more subtractors, one or more shifters, and/or one or more comparators) are used to calculate a normalized probability of a symbol occurrence from the given set of symbols.

According to various embodiments, a Normalized Probability (NP) of a symbol occurrence from the given set of symbols can be determined as follows $$\begin{aligned} NP(s_n) &= (f(s_n) * A)/F & \text{where, } F &= \sum_{k=0}^n f_k \\ &= x_n/F & x_n &= (f(s_n) * A), \\ &= ((y_n * F) + z_n)/F & ((y_n * F) + z_n &== x_n), \\ &= y_n + r_n & (r_n &= z_n/F) \end{aligned}$$

An example of generated normalized probability using an accuracy log A of 256, for symbols a-e is as follows.

| $s_n$ | f ($s_n$) | F | NP ($s_n$) | $y_n$ |
|---|---|---|---|---|
| A | 10 | 160 | 16 | 16 |
| B | 21 | | 34 | 34 |
| C | 32 | | 50.75 | 50 |
| D | 43 | | 68.50 | 69 |
| E | 54 | | 86.75 | 87 |

As used above, $f(s_n)$ can represent a number of occurrences of symbol $s_n$ (which can include one or more characters);

F can represent a summation of occurrences of all symbols;

$x_n$ can represent a symbol occurrences multiplied by accuracy log;

$z_n$ can be realized as fraction value of $x_n$ that is not multiple of F; and $y_n$ can represent an integer portion of an NP.

Note that a level of decimal accuracy can be tuned based on a value of A. For example, a level of decimal accuracy (e.g., 0.2, 0.25, 0.33, and so forth) can be set based on a value of A.

Figure 4:
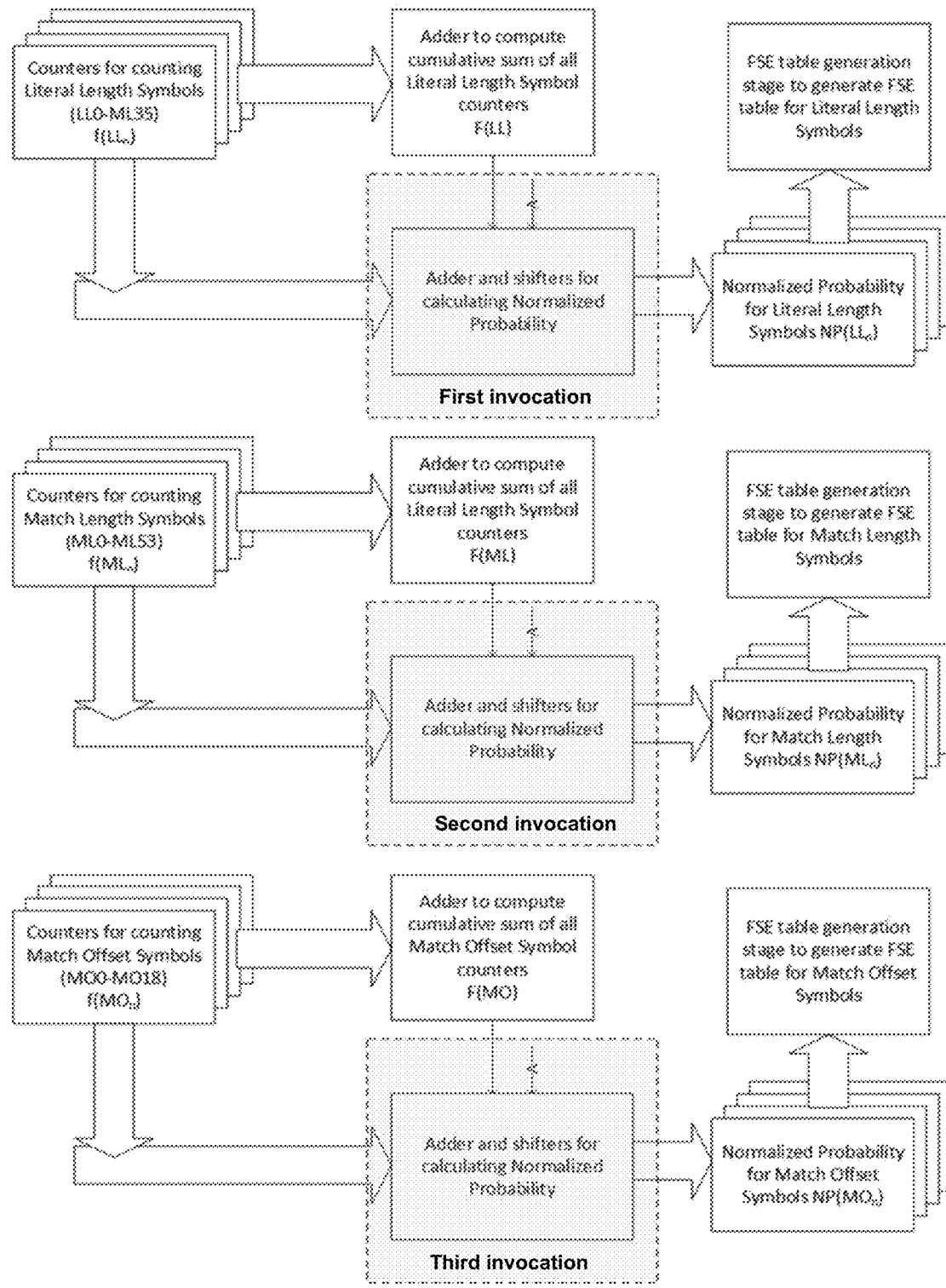
FIG. 4 depicts an example flow of FSE table generation portion for ZSTD sequence symbols in accordance with various embodiments.

FIG. 4 depicts an example sequence in accordance with various embodiments. As shown, instead of three invocations of FPU or other complex circuitry like dividers, using various embodiments three invocations of basic arithmetic building blocks (e.g., one or more adders, one or more subtractors, one or more shifters, and/or one or more comparators) are used to generate Normalized Probability of literal length symbol occurrence ($NP(LL_n)$), Normalized Probability of match length symbol occurrence ($NP(ML_n)$), and Normalized Probability of match offset symbol occurrence ($NP(MO_n)$).

In some examples, merely one or more shifters and one or more adders can be used to approximate an NP. To perform subtraction, a 2s complement of a number can be performed to change its sign from negative to positive or positive to negative and the changed-sign number can be added to another number. A comparator can be implemented using a subtractor to determine if two numbers are the same or different. If a subtraction operation of a second number subtracted from a first number yields a borrow operation, the first number is less than the second number; if there is no borrow operation, the first number is higher than the second number; or if subtraction of the two numbers yields zero, the numbers are the same.

Figure 5A:
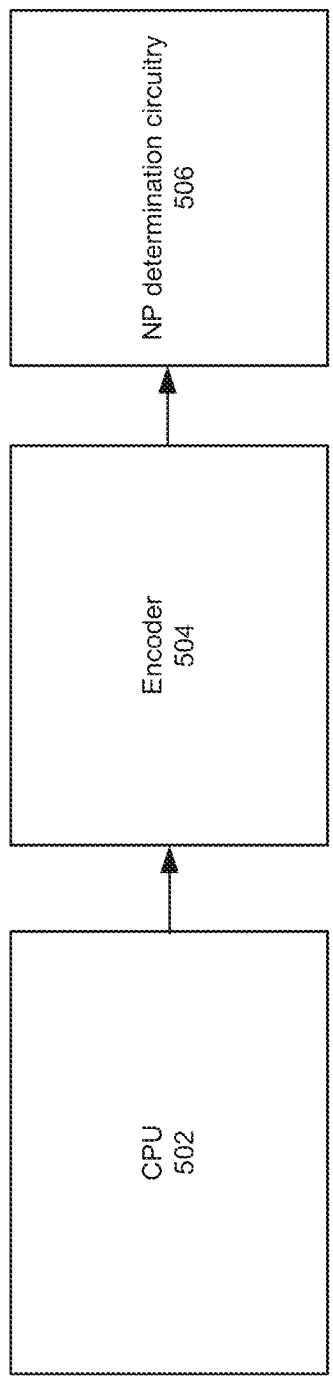
FIG. 5A shows an example of use of a normalized probability generation circuitry in accordance with various embodiments.

FIG. 5A shows an example of use of a NP determination circuitry. For example, a CPU 502 can request encoder 504 to encode data prior to transmission of the data or prior to storage of the data into memory or storage. Encoder 504 can generate literal length symbol occurrences, match length symbol occurrences, and match offset symbol occurrences of one or more symbols (e.g., character strings of one or more characters) in accordance with lossless or lossy compression of the data using any compression algorithms such as, but not limited to, Lempel-Ziv (LZ) (e.g., LZ77 and LZ4) or GNU zip (gzip), GIF (Graphics Exchange Format), CCSDS (Consultative Committee for Space Data Systems) Lossless Data Compression Standards, and Zstandard (e.g., compression ratios that support Zstandard Level 9).

NP determination circuitry 506 can calculate NPs of literal length symbol occurrence, match length symbol occurrence, and match offset symbol occurrence for one or more using basic arithmetic blocks (e.g., one or more adders, one or more subtractors, one or more shifters, and/or one or more comparators). For example, basic arithmetic blocks can be implemented as an accelerator chip or integrated into a CPU. NP determination circuitry 506 can be implemented using arithmetic logic units (ALUs) invoked by execution of instructions by a processor. For example, an ALU can include an adder and a shifter or other arithmetic blocks. NP determination circuitry 506 can be implemented as processor-executed instructions that request addition, subtraction, bit shifting (right or left) or comparison by one or more ALUs. NP determination circuitry 506 can be coupled to a CPU or core(s) using a bus (e.g., PCIe, CXL, DDR), part of a system-on-chip (SoC) with a CPU or core(s), or integrated into a die with a CPU or core(s).

In some examples, an FPU can be used but for other purposes than to perform determination of normalized probability of literal length symbol occurrence, match length symbol occurrence, and match offset symbol occurrence. Various embodiments estimate NP with less power use than if NP were estimated or determined using an FPU, while maintaining entropy integrity for lossless data compression and abiding by predetermined limits of entropy (e.g., measure of limit of lossless compression).

Figure 5B:
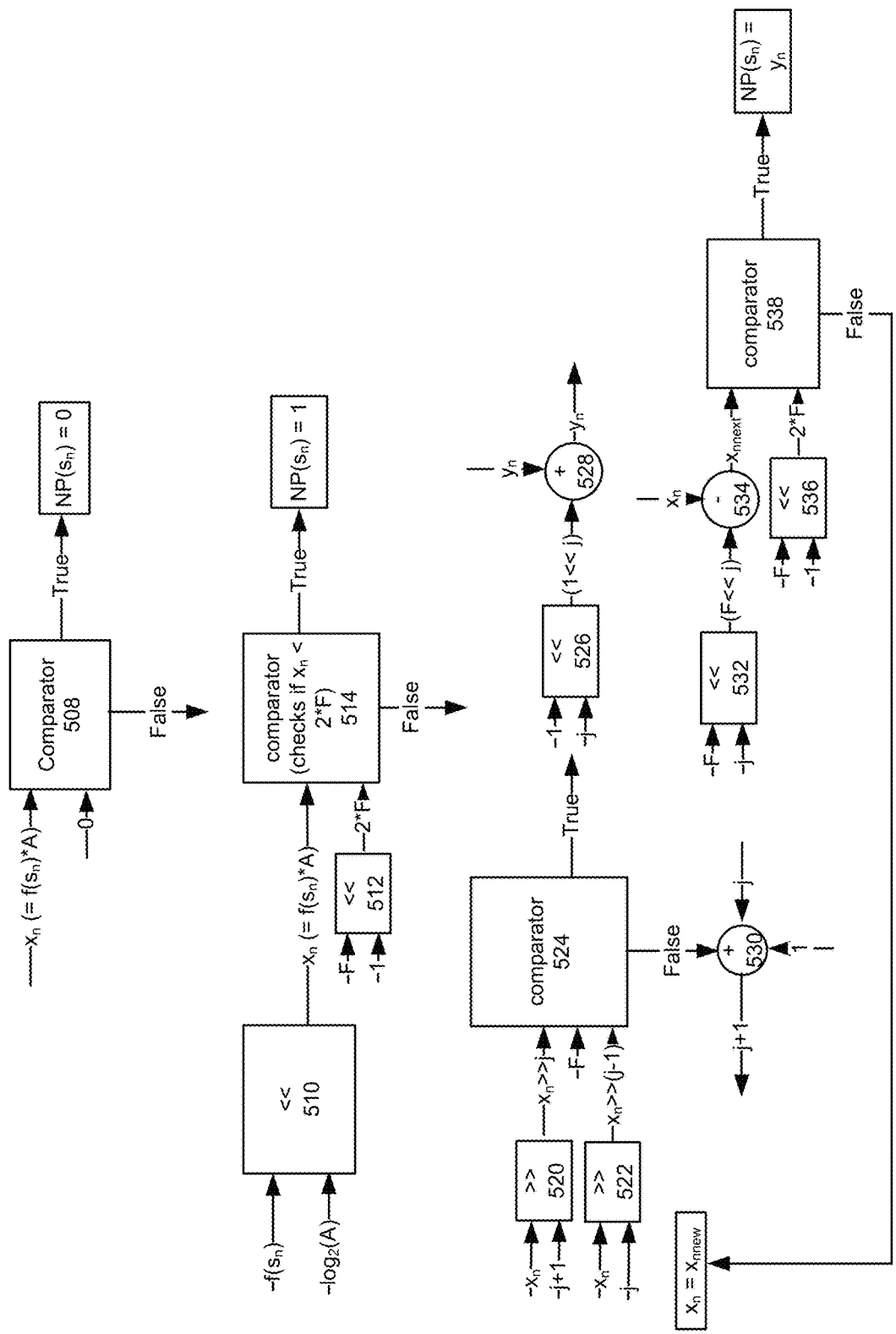
FIG. 5B depicts an example of a normalized probability generation circuitry in accordance with various embodiments.

FIG. 5B depicts an example manner for calculating normalized probability of a given symbol occurrence from the given set of symbols using various embodiments. For example, estimated normalized probability can be performed for literal length symbol occurrence, match length symbol occurrence, and match offset symbol occurrence. In some examples, arithmetic circuitry or one or more ALUs can be used, whereas in other embodiments, processor executable instructions can be used. In this example, numbers can be in unsigned integer format although other formats of numbers can be used.

In FIG. 5B, a left shift operation is represented as symbol "<<" which fills in one or more zeros in the least significant bits; a right shift operation is represented as symbol ">>" which fills in one or more zeros in the most significant bits; an addition operation is represented by symbol "+"; and an subtraction is represented by "−".

At 508, a comparison is made between $x_n$ (e.g., $f(s_n)*A$) and 0 to determine if $x_n=0$. If $x_n=0$, then $NP(s_n)=0$. Otherwise, the logic of 510 to 514 can be performed.

At 510, $f(s_n)$ is left shifted by log 2(A) bits to output $x_n$. In some examples, $f(s_n)$ can represent a number of occurrences of a symbol $s_n$. In some examples, A can represent an accuracy log value described for example in Section 3.1.1.3.2.1 Sequences_Section_Header of a ZSTD specification. In some examples, $x_n$ can represent $f(s_n)$ multiplied by accuracy log A. At 512, F is left shifted by 1 bit to produce 2*F. In some examples, F can represent a summation of occurrences of all symbols $s_n$. At 514, a comparator checks if $x_n<2F$. If so, the output is True, and $NP(s_n)=1$. If $x_n=2F$ or $x_n>2F$, the output is False and additional operations are performed to determine $NP(s_n)$.

For an output of False, iterations of 520-538 are performed for a loop counter of j. At 520, $x_n$ is right shifted by a number of bits equal to j+1 (represented as $x_n>>j+1$). At 522, $x_n$ is right shifted by a number of bits equal to j (represented as $x_n>>j$). At 524, a comparator checks if $(x_n>>j+1)<F$ AND $(x_n>>j) \geq F$. If the output from the comparator is False, loop counter j is incremented by 1 and 520 and 522 are performed again (and ensuing activities). If the output from the comparator is True, value 1 is left shifted by a number of bits equal to j (represented as $1<<j$). At 528, $y_n$ is added to $(1<<j)$ to produce $y_n$, which may represent a $NP(s_n)$ if various conditions are satisfied (described next).

At 532, F is left shifted by a number of bits equal to j (represented as $F<<j$). At 534, $(F<<j)$ is subtracted from $x_n$ to generate $x_{nnext}$. At 536, F is left shifted by a 1 bit (represented as $F<<1$) to produce 2*F. At 538, a comparison is made to determine if $x_{nnext}<2*F$. If $x_{nnext}<2*F$, then a $NP(s_n)$ is determined to be $y_n$. If $x_{nnext} \geq 2*F$, then $x_n$ is set to $x_{nnew}$ and 520 and 522, and ensuing operations take place. For example, $x_{nnew}=x_n-(F<<j)$.

Figure 5C:
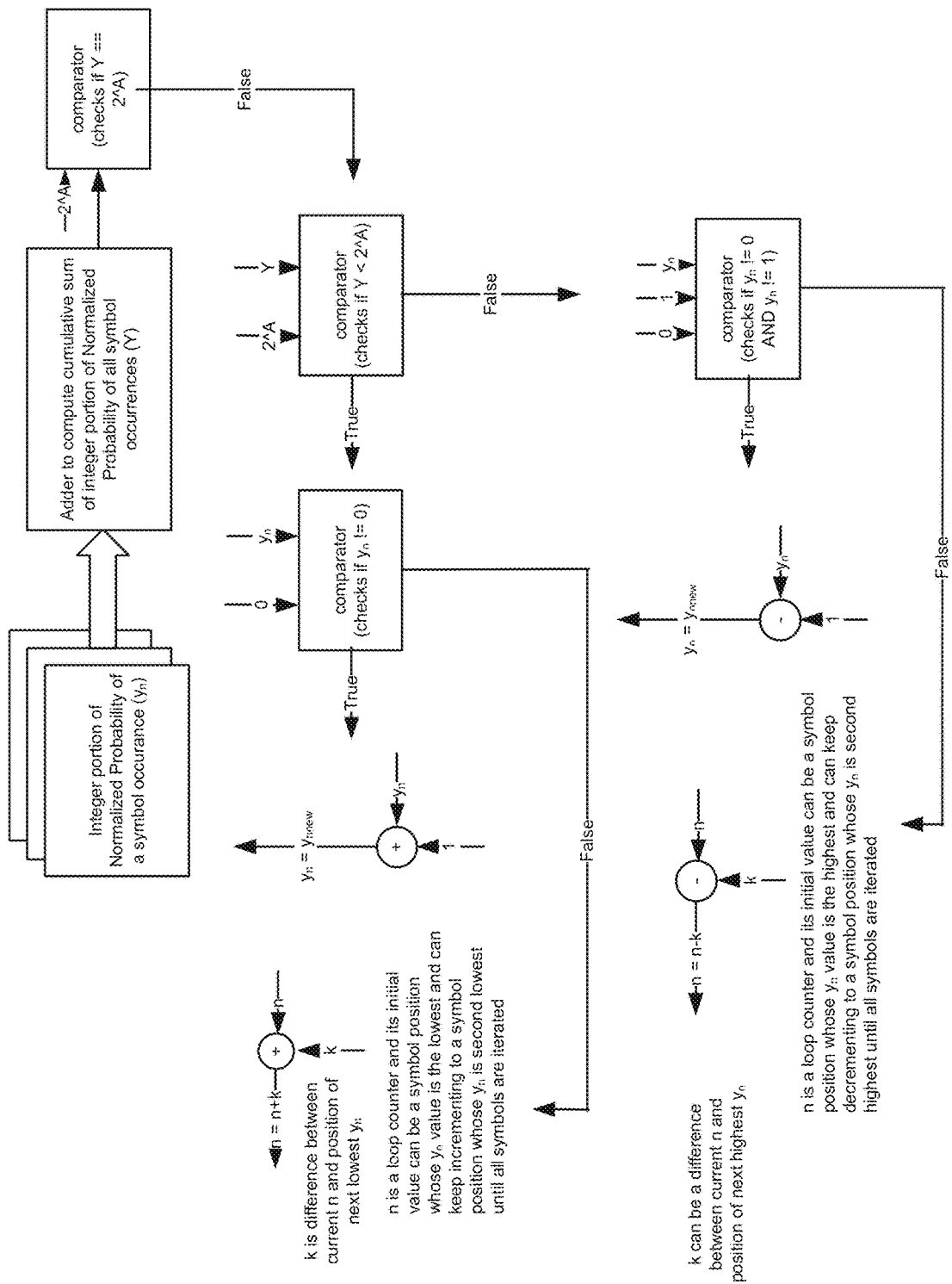
FIG. 5C depicts an example manner of adjusting normalized probability in accordance with various embodiments.

Once normalized probability of all symbols are calculated, a final adjustment is performed to whether to adjust $y_n$ and can include (1) summation of integer portions of normalized probability of all symbols; (2) if summation is greater than $2^A$, then a value of 1 subtracted starting from highest normalized probability symbol until total summation of integer portion of normalized probability of all symbols is not equal to $2^A$; or (3) if summation is less than $2^A$, then a value of 1 is added starting from a lowest normalized probability symbol until total summation of integer portion of normalized probability of all symbols is not equal to $2^A$. If summation of integer portions of normalized probability of all symbols is $2^A$, then $NP(s_n)=y_n$. FIG. 5C depicts an example use of comparators, adders, and subtractors to determine whether to adjust $y_n$.

Note that operations of FIG. 5B and FIG. 5C can both be applied to determine occurrences of Huffman weights described in Section 4.2.1.2. FSE Compression of Huffman Weights of the ZSTD specification.

Figure 6:
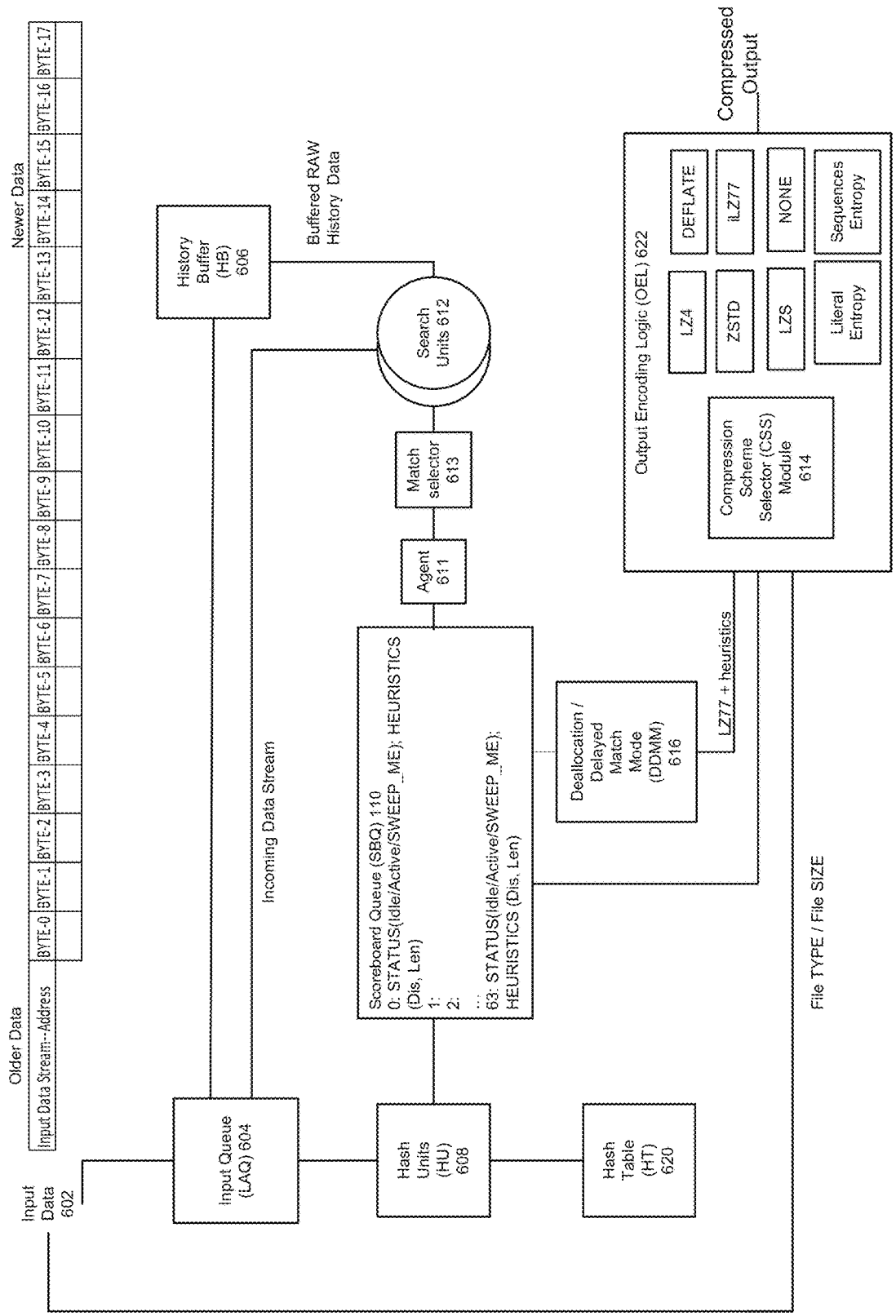
FIG. 6 depicts a system.

FIG. 6 depicts a block diagram of a compression engine that selects a compression scheme to apply to an input data stream. A compression engine can capture and analyze heuristics during hash and search stages to select a lossless encoding algorithm. Heuristics can include one or more of: search string match length ("Len"), search distance offset from the search string match to a prior instance of the string ("Dis"), and a literal length distance between two pattern matches, expressed in length of the literals, from an end of a first pattern to start of a second pattern, where the second pattern is the same or different than the first pattern ("Lit Len"), as well as input stream size and input stream type. Lossless encoding schemes can include encoding schemes such as the LZ family including, but not limited to, LZ77, LZ4, LZS, Zstandard, DEFLATE, Huffman coding, and Snappy standards and derivatives. For example, LZ77 streams are described in Ziv et al., "A Universal Algorithm for Sequential Data Compression" IEEE Transactions on Information Theory (May 1977).

Input data 602 can be written into Look-Aside-Queue (LAQ) 604. Input data 602 can be uncompressed data of raw data code or a "literal" that designates the character as plain text or clear text. Input data 602 can be segmented at a character level or byte level. A byte can be a character for ASCII scheme. Other schemes can be used to represent characters such as UTF-8, where a character can span more than 1 byte.

Three pointers can be associated with Look-Aside-Queue 604, namely, a tail pointer, a head pointer, and a current pointer. The received uncompressed data 602 is inserted at the tail of LAQ 604. The tail pointer stores the location (entry) in LAQ 604 in which data can be inserted in LAQ 604. The head pointer identifies the entries in the LAQ 604 that store data that has been compressed using an encoder and can be flushed from LAQ 604. After data from LAQ 604 has gone through encoding, the data at the head pointer is flushed into HB 606 at the HB write pointer. The number of bytes flushed to HB 606 can vary depending on implementation and compression standard. The current pointer can refer to the position at which the Hash Units 608 will get their next input data, and normally advances by the number of HUs 608 (e.g., 8 bytes). A HU can be assigned a current stream position.

In some examples, hash units (HU) 608 can perform hash operations on 3 to 4 byte groups of input data from LAQ 604 to determine History Buffer Addresses (HBAs) of potential prior data positions where a match could be found. For example, compression scheme LZ4 can use a 4-byte hash function, whereas compression scheme DEFLATE can use a 3-byte hash function. Sizes other than 3 to 4 bytes can be used such as 1 byte, 2 bytes, 5 bytes, and so forth. In an example where HU 608 can perform hash and lookup operations on 8 groups of bytes in parallel (e.g., groups with bytes 0-2, 1-3, 2-4, 3-5, 4-6, 5-7, 6-8, and 7-9 represented as groups 0 to 7 respectively), HU 608 can read groups 0-7 from LAQ 604 starting at the LAQ current position. For a 3-byte hash as an example, if the bytes in LAQ 604 are "ABCDEFGHIJKLMN", then 8 hash functions are performed on the 3 bytes: "ABC", "BCD", "CDE", "DEF", "EFG", "FGH", GHI, and "HIJ". HU 608 may hash groups 0-7 and can search the hash results against hashes stored in hash table 620. A hash function is applied to produce a 12-bit hash table index, for example.

Hash table (HT) 620 can store hash values/index values and corresponding HBAs. In some embodiments, there are 32 banks of HT memory in order to reduce the average number of bank conflicts from the 8 Hash Units 108 read requests to the HT. A bank can provide up to 16 HBAs to the HU 608 requesting the bank. In some embodiments, 16 parallel Hash Tables (HTs) 620 are provided, allowing storing and retrieving up to 16 HBAs with a single hash table index. Retrieving up to 16 HBAs can allow for up to 16 search operations for a given byte position. The hash index provides the read address (bank number plus location within the bank) to retrieve the HBAs. HT 620 can provide corresponding HBAs (e.g., up to 16) for a hash index. If there is no entry for a hash index in HT 620, HT 620 can provide no HBA or an indication of an invalid entry. An HBA can represent a prior stream position that is a potential match with a current group position. HU 608 can write a group position (e.g., 0-7) for the first 8 bytes of input data and corresponding hash index into an entry in HT 620. For subsequent input bytes, the group position could increase. A hash index can be the location (address) in the HT that can be read, written-to, or overwritten.

Hash Unit 608 can compare the current stream position (LQA) against the retirement pointer when updating its corresponding SBQ entry or entries. A retirement pointer can indicate a position of the input data that has not been encoded into an LZ77 stream (or other stream) and is next in line to be encoded. The retirement pointer can be updated during the encoding stage based on characters provided for inclusion in the LZ77 stream. The retirement pointer can indicate a position of the input data that has not been encoded into an LZ77 stream (or other stream) and is next in line to be encoded. If the retirement pointer is greater than the current stream position (LQA), Hash Unit 608 can set the Squash Bit (SQH) when updating its corresponding SBQ entry or entries.

HU 608 may output to SBQ 610 identified history addresses (HBAs) and a valid indication (e.g., present in the HT 620 and in range of the History Buffer window). Agent 611 can monitor SBQ 610 and in response to valid HBAs being available, agent 611 triggers one or more search units (SUs) 612 to perform a search for a prior portion of input data 602. SUs 612 can attempt to find data string(s) from LAQ 604 or HB 606 using the HBA to find a match for an input data string. SUs 612 can retrieve from SBQ 610 one or more of (entry number, Stream ADDR (e.g., stream position LQA), history address (HBA)). Middle bits of the HBA can be used to convert an HBA to a position or memory location in LAQ 604 or HB 606. SU 612 can compare data from LAQ 604 or HB 606 provided based on the HBA with characters of a group position for which HU 608 identified a potential match. In some examples, SU 612 can process chunks of 16 bytes or other sizes.

If a match is found, SU 612 may supply the Dis and Len that is found corresponding with its stream (group) position. A match selector 613 can choose a result from multiple SUs 612 with a longest character match (Len) and if Len of several search results are the same, a result with the smallest offset (Dis) is selected. Match selector 613 may provide the Len and Dis to SBQ 610 for the character string associated with the selected Len and Dis and a character string (e.g., token) is available for encoding a corresponding current group position. If no match is found between any characters of the group position that caused the HU 608 to provide the HBA and the segment retrieved from LAQ 604 or HB 606 using the HBA, a literal can be made available for encoding a corresponding current group position. For example, for a hash involving bytes 0-2, a result will be placed in entry 0.

In some embodiments, when SUs 612 are finished searching a group of one or more character strings, a SWEEP_ME signal is triggered. SWEEP_ME state can trigger deallocation to remove one or more entries from scoreboard queue 610 and copy input strings associated with deallocated entries from LAQ 604 to history buffer 606.

History buffer (HB) 606 can be used to store clear text data or plain text data ("history data") that has been processed by an encoder. The clear text data stored in the history buffer 606 can be referred to as a "dictionary." The dictionary can be created on the fly during compression and re-created on the fly during decompression. History buffer 606 acts a sliding window/circular queue. When the history buffer 606 is full, the oldest data at the head of the history buffer 606 is overwritten by data read from LAQ 604 that has been processed by an encoder. A size of HB 606 can vary depending on a compression standard used (e.g., DEFLATE, LZ4, LZ77). For example, HB 606 can be setup as 32 KB for DEFLATE compression and 64 KB for LZ4.

Scoreboard Queue (SBQ) 610 can be used by HU 608, SUs 612, and DDMM logic 616 as an information repository. In one example, SBQ 610 can track 64 consecutive stream positions (e.g., 0 to 63, 1 to 64, 2 to 65, and so forth). A position is the starting point for attempting to search for as long a match as possible. The following table provides a generic list of elements stored in an SBQ entry for a group byte position index.

input position. For example, DDMM 616 can compare an identified token of a first stream position with tokens for the next two consecutive stream positions, and if either position has a longer match, the identified token for the first stream position is converted into a literal. DDMM 616 can hold a match result of a token for a position to make a delayed match decision based on literals or token(s) for next consecutive or later stream positions.

For example, from SBQ 610, available literal or token representations of three consecutive entries can be examined to determine whether to provide any token in the consecutive entries to an LZ77 stream or to use the literal instead. In other embodiments, more or fewer than three consecutive entries can be examined. For example, when consecutive entries 0-2 have search results indicating a literal and zero or more tokens, and entry 0 represents a portion of an input stream that is received earlier in time than that of entry 1, and entry 1 represents a portion of an input stream that is received earlier in time than that of entry 2. In a case where entry 0 is a literal, the literal for entry 0 can be encoded in an LZ77 stream. However, if entry 0 is represented by a token that is longer than a token for entry 1 and a length of a token for entry 2 is not two or more characters longer than a length of a token for entry 0, then the token for entry 0 is provided for inclusion in the LZ77 stream. If entry 0 is represented by a token that is longer than a token for entry 1 and entry 2 is a literal, then the token for entry 0 is provided for inclusion in the LZ77 stream. If entry 0 is represented by a token, entry 1 is a literal, and entry 2 is a literal, then the token for entry 0 is provided for inclusion in the LZ77 stream.

In some embodiments, if entry 0 is represented by a token, entry 1 is represented by a token, and if the token for entry 1 is longer than the token for entry 0, then the entry 0 is reverted to its literal and provided for inclusion in the LZ77 stream but the token for entry 1 is held for a delayed match decision against literal(s) or zero or more token(s) in later stream positions. The token for entry 1 can be held for examination of entries 1, 2, and 3 or entry 1 and other entries.

| Element | Example Description |
| --- | --- |
| SBS | Indicates the present SBQ state (e.g., idle state, SU state, SWP state) |
| SBQ Idle (SBI) | When set this bit indicates that the SBQ is in use. This bit is cleared after the encoding. |
| Leading LAQ Byte (LQB) | The first byte of the 3-byte or 4-byte hash that was hashed. This can be the literal byte at the stream position (from the Hash Unit). |
| Leading Byte Address (LQA) | Location in LAQ for comparing against the History Buffer location(s). This can be the stream address (from the Hash Unit). |
| History Buffer Address [0:15] | In some examples, up to 16 History Buffer Address (HBA) are read from the HT 620 by HU 608. These HBAs are used for search operations in the LAQ 604 or HB 606. |
| Match Length [n]/Match Offset Array [n] | List of search results from SUs. DDMM logic 616 can use these values to encode the input stream. |
| Search Match Offset (SMO) | Variable Dis from search units. |
| Search Match Length (SML) | Variable Len is Search Match Length (from SUs). |
| Squash bit (SQH) | DDMM logic 616 can set this bit to indicate that the leading LAQ byte has already been used by a previous match. |

According to some embodiments, Deallocation and Delay Match Mode (DDMM) 616 receives match results for consecutive input stream positions and can decide which tokens (e.g., character or byte sequence) are chosen for inclusion in an LZ compression stream encoding. DDMM 616 can delay the selection of token matches from multiple search results such that after a match of length N has been found, the DDMM 616 searches for a longer match starting at the next In some embodiments, if entry 0 and entry 1 are represented by tokens, but the token for entry 1 is not longer than the token for entry 0, and the entry 2 is represented by a token that is at least two characters longer than the token representing entry 0, then the tokens for entry 0 and entry 1 are rejected and literals corresponding to entry 0 and entry 1 are provided for inclusion in the LZ77 stream. In other examples, instead of at least two characters difference between a token for entry 2 and a token for entry 0, other numbers can be used such as 1, 3, 4 and so forth. The token for entry 2 can be held for examination of entries 2, 3, and 4 or entry 2 and other entries.

DDMM 616 can maintain a retirement pointer that identifies a next stream position that has not been included in the LZ77 stream (or other type of stream, e.g., LZ78) for the input data stream. The retirement pointer can be updated to refer to the next position in an input stream that has not been selected for inclusion in the LZ77 stream. After DDMM 616 selects a token or literal for an input stream position, the retirement pointer can be updated to point to a literal after the token or literal that has been selected for inclusion in the LZ77 stream. The retirement pointer can be sent to SBQ 610 to squash SBQ entries that are less than the current retirement pointer because those results will not be used.

DDMM 616 can squash (suppress) incoming stream positions that are less than the current retirement pointer from inclusion into the LZ77 stream. In cases where the current position pointer (LQA) does not match the retirement pointer, a literal or token referred to by the current position pointer can be discarded and the current position pointer can be advanced.

DDMM 616 can stop one or more search units from searching for matches within an incoming uncompressed data stream. Advancing the retirement pointer frees search units to search after the committed literal or token and avoid performing operations that have been completed. SUs 612 corresponding to squashed SBQ entries can stop search for matches and powered down or allocated for searching for matches for other SBQ entries.

DDMM device 616 can use contents of the SBQ entries to generate a representation of an input data stream and the representation can be an LZ77 stream. Deallocation and delayed match mode (DDMM) device 616 can receive or retrieve serial, in-order, results from SBQ 610 indicating Dis, Len, and a literal (as the case may be) for a group position. For example, DDMM device 616 can receive the match results for 8 consecutive stream positions from SBQ 610 and can decide which tokens will be chosen for the LZ77 stream. DDMM 616 can generate an LZ77 stream with literals and zero or more tokens. DDMM 616 can generate a literal length (Lit Len) for an LZ77 stream, where literal length can represent a gap, expressed in lengths of the literals, between two pattern matches (e.g., tokens) from an end of a first pattern to start of a second pattern, where the second pattern is the same or different than the first pattern. For example, DDMM 616 can provide Output Encoding Logic (OEL) the following information directly or via Score Board Queue (SBQ).

input stream position i and is not squashed, it is directly sent to output encoding logic (OEL) 622, and the retirement pointer is incremented to position i+1. When a token of length L is encountered at stream position i and is not squashed, it is directly sent to OEL 622 and the retirement pointer is advanced to stream position i+L. As a result, the next (L−1) stream positions can be squashed and DDMM 616 can send the next literal or token starting at stream position (i+L).

Compression scheme selector (CSS) module 614 can use literal length (Lit Len) from DDMM 616 and Dis and Len from DDMM 616 or SBQ 610. CSS module 614 can select a compression engine to use (e.g., LZ4, DEFLATE, Zstandard (ZSTD), LZS, none, and so forth) to compress the LZ77 format stream based on a file type, file size, and heuristics of the stream of LZ77 stream. A file type can include text, image, media, although other types can be used. A file size can be a size of an uncompressed input stream in kilobytes and megabytes but other sizes can be used. For example, compression scheme selector (CSS) module 614 can perform any of one or more: (1) calculate percentage representations of Len, Dis, Lit Len; (2) calculate standard deviations of Len, Dis, and Lit Len; (3) compare those values against pre-determined criteria; and (4) determine encoding/compression scheme for Output Encoding Logic 622 to use to encode/compress an LZ77 stream based at least on the criteria. Criteria for selecting an encoding scheme can be set by cloud/communications service provider or generated by artificial intelligence (AI). The compressed stream can be output for transmission to a device or stored for later access to reduce memory or storage use.

Figure 7:
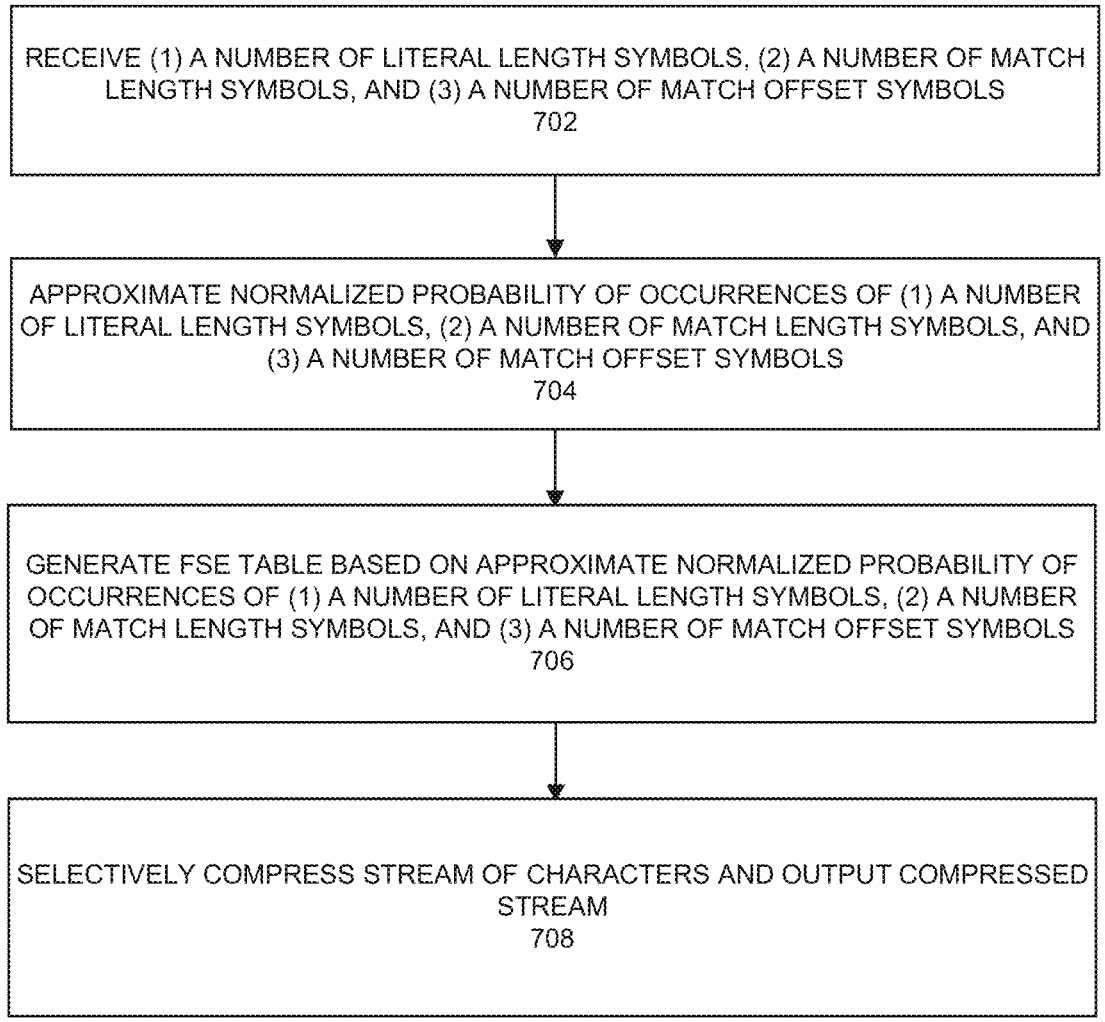
FIG. 7 depicts a process.

FIG. 7 depicts a process to generate a normalized probability for occurrences of one or more symbols in connection with file compression. Various embodiments described herein can be used in a central processing unit (CPU), network interface products, hardware accelerator devices, or other implementations.

At 702, (1) a number of literal length symbols, (2) a number of match length symbols, and (3) a number of match offset symbols can be received. For example, (1) a number of literal length symbols, (2) a number of match length symbols, and (3) a number of match offset symbols can be made available. For example, an LZ77 stream can be provided (e.g., from DDMM 616) for subsequent encoding or compression.

At 704, an approximation of normalized probability of occurrences of (1) a number of literal length symbols, (2) a number of match length symbols, and (3) a number of match offset symbols can be determined. For example, one or more adders, one or more subtractors, one or more shifters, and/or

| Field | Example description |
| --- | --- |
| Valid | Valid bits for 8 possible LZ77 results. |
| EOF | Indicates the last set of LZ77 output, or if none of the output is valid, that no more LZ77 output is available. |
| Length | Lengths for 8 LZ77 results. A length of 1 indicates a literal (value = LQB), otherwise a <Length, Distance> pair (token). |
| Distance | Distances for 8 LZ77 results. |
| Literal Length | A gap between pattern matches. |
| LQB | Leading bytes for the 8 LZ77 results (used for literals) |

If delayed match decision mode is disabled and a candidate token is not held for comparison against subsequent tokens or literals to determine whether the candidate token is to be included in the LZ77 stream, DDMM 616 can perform the following. When a literal is encountered at an one or more comparators can be used to approximate normalized probability. In some examples, arithmetic circuitry or one or more ALUs can be used, whereas in other embodiments, processor executable instructions can be used. An FPU need not be used in some embodiments. For example, based on a value of accuracy log (A) applied, approximate normalized probability can be determined to a decimal place of 0, 0.25, 0.5, or 0.75. However, other decimal increments can be used such as 0, 0.33, 0.66; 0, 0.2, 0.4, 0.6, 0.8; and so forth.

At 706, the approximation of normalized probability of occurrences of (1) a number of literal length symbols, (2) a number of match length symbols, and (3) a number of match offset symbols can be used to determine an FSE table. An example of how normalized probability of sequence symbol occurrence can be used to build an FSE table is described with respect to RFC 8478: section 4.1.1 FSE Table Description.

Any type of decoder (e.g., ZSTD) can be used to generate data from compressed data where the compressed data is generated based on approximation of normalized probability using one or more adders, one or more subtractors, one or more shifters, and/or one or more comparators. The decoder can be a programmable device accessible to a CPU or part of a CPU die or provided in a network interface or accessible to a network interface.

At 708, encoding of a stream and output of the encoded stream can occur. For example, a compression scheme can be selected to compress an LZ77 stream and encoding the stream using any of LZ4, ZSTD, iL77, LZS, no compression, or other compression schemes. For example, the determined FSE table can be used to encode a stream of characters in accordance with section 4.1 FSE of the ZSTD specification. The encoded stream can be stored in memory, storage, or persistent memory or transmitted using a network interface to another device for processing or storages.

Figure 8:
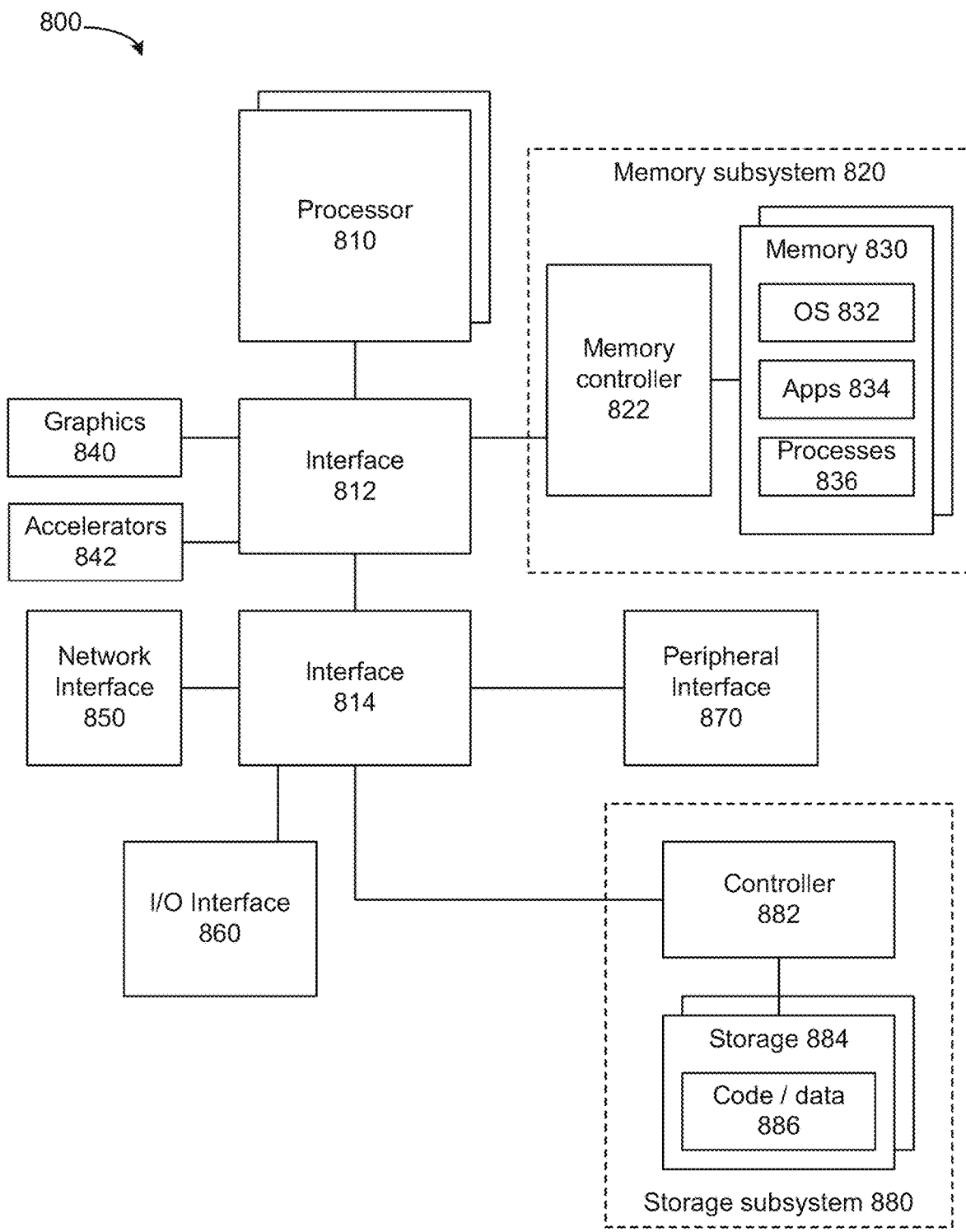
FIG. 8 depicts a system.

FIG. 8 depicts a system. The system can use embodiments described herein to encode data using techniques described herein. System 800 includes processor 810, which provides processing, operation management, and execution of instructions for system 800. Processor 810 can include any type of microprocessor, central processing unit (CPU), graphics processing unit (GPU), processing core, or other processing hardware to provide processing for system 800, or a combination of processors. Processor 810 controls the overall operation of system 800, and can be or include, one or more programmable general-purpose or special-purpose microprocessors, digital signal processors (DSPs), programmable controllers, application specific integrated circuits (ASICs), programmable logic devices (PLDs), or the like, or a combination of such devices.

In one example, system 800 includes interface 812 coupled to processor 810, which can represent a higher speed interface or a high throughput interface for system components that needs higher bandwidth connections, such as memory subsystem 820 or graphics interface components 840, or accelerators 842. Interface 812 represents an interface circuit, which can be a standalone component or integrated onto a processor die. Where present, graphics interface 840 interfaces to graphics components for providing a visual display to a user of system 800. In one example, graphics interface 840 can drive a high definition (HD) display that provides an output to a user. High definition can refer to a display having a pixel density of approximately 100 PPI (pixels per inch) or greater and can include formats such as full HD (e.g., 1080p), retina displays, 4K (ultra-high definition or UHD), or others. In one example, the display can include a touchscreen display. In one example, graphics interface 840 generates a display based on data stored in memory 830 or based on operations executed by processor 810 or both. In one example, graphics interface 840 generates a display based on data stored in memory 830 or based on operations executed by processor 810 or both.

Accelerators 842 can be a programmable and/or fixed function offload engine that can be accessed or used by a processor 810 or network interface 850. For example, an accelerator can include one or more offload processors described herein. For example, an accelerator among accelerators 842 can provide compression (DC) capability, cryptography services such as public key encryption (PKE), cipher, hash/authentication capabilities, decryption, or other capabilities or services. In some embodiments, in addition or alternatively, an accelerator among accelerators 842 provides field select controller capabilities as described herein. In some cases, accelerators 842 can be integrated into a CPU socket (e.g., a connector to a motherboard or circuit board that includes a CPU and provides an electrical interface with the CPU). For example, accelerators 842 can include a single or multi-core processor, graphics processing unit, logical execution unit single or multi-level cache, functional units usable to independently execute programs or threads, application specific integrated circuits (ASICs), neural network processors (NNPs), programmable control logic, and programmable processing elements such as field programmable gate arrays (FPGAs). Accelerators 842 can provide multiple neural networks, CPUs, processor cores, general purpose graphics processing units, or graphics processing units can be made available for use by artificial intelligence (AI) or machine learning (ML) models. For example, the AI model can use or include any or a combination of: a reinforcement learning scheme, Q-learning scheme, deep-Q learning, or Asynchronous Advantage Actor-Critic (A3C), combinatorial neural network, recurrent combinatorial neural network, or other AI or ML model. Multiple neural networks, processor cores, or graphics processing units can be made available for use by AI or ML models.

Memory subsystem 820 represents the main memory of system 800 and provides storage for code to be executed by processor 810, or data values to be used in executing a routine. Memory subsystem 820 can include one or more memory devices 830 such as read-only memory (ROM), flash memory, one or more varieties of random access memory (RAM) such as DRAM, or other memory devices, or a combination of such devices. Memory 830 stores and hosts, among other things, operating system (OS) 832 to provide a software platform for execution of instructions in system 800. Additionally, applications 834 can execute on the software platform of OS 832 from memory 830. Applications 834 represent programs that have their own operational logic to perform execution of one or more functions. Processes 836 represent agents or routines that provide auxiliary functions to OS 832 or one or more applications 834 or a combination. OS 832, applications 834, and processes 836 provide software logic to provide functions for system 800. In one example, memory subsystem 820 includes memory controller 822, which is a memory controller to generate and issue commands to memory 830. It will be understood that memory controller 822 could be a physical part of processor 810 or a physical part of interface 812. For example, memory controller 822 can be an integrated memory controller, integrated onto a circuit with processor 810.

While not specifically illustrated, it will be understood that system 800 can include one or more buses or bus systems between devices, such as a memory bus, a graphics bus, interface buses, or others. Buses or other signal lines can communicatively or electrically couple components together, or both communicatively and electrically couple the components. Buses can include physical communication lines, point-to-point connections, bridges, adapters, controllers, or other circuitry or a combination. Buses can include, for example, one or more of a system bus, a Peripheral Component Interconnect (PCI) bus, a Hyper Transport or industry standard architecture (ISA) bus, a small computer system interface (SCSI) bus, a universal serial bus (USB), or an Institute of Electrical and Electronics Engineers (IEEE) standard 1394 bus (Firewire).

In one example, system 800 includes interface 814, which can be coupled to interface 812. In one example, interface 814 represents an interface circuit, which can include standalone components and integrated circuitry. In one example, multiple user interface components or peripheral components, or both, couple to interface 814. Network interface 850 provides system 800 the ability to communicate with remote devices (e.g., servers or other computing devices) over one or more networks. Network interface 850 can include an Ethernet adapter, wireless interconnection components, cellular network interconnection components, USB (universal serial bus), or other wired or wireless standards-based or proprietary interfaces. Network interface 850 can transmit data to a device that is in the same data center or rack or a remote device, which can include sending data stored in memory. Network interface 850 can receive data from a remote device, which can include storing received data into memory. Various embodiments can be used in connection with network interface 850, processor 810, and memory subsystem 820.

In one example, system 800 includes one or more input/output (I/O) interface(s) 860. I/O interface 860 can include one or more interface components through which a user interacts with system 800 (e.g., audio, alphanumeric, tactile/touch, or other interfacing). Peripheral interface 870 can include any hardware interface not specifically mentioned above. Peripherals refer generally to devices that connect dependently to system 800. A dependent connection is one where system 800 provides the software platform or hardware platform or both on which operation executes, and with which a user interacts.

In one example, system 800 includes storage subsystem 880 to store data in a nonvolatile manner. In one example, in certain system implementations, at least certain components of storage 880 can overlap with components of memory subsystem 820. Storage subsystem 880 includes storage device(s) 884, which can be or include any conventional medium for storing large amounts of data in a nonvolatile manner, such as one or more magnetic, solid state, or optical based disks, or a combination. Storage 884 holds code or instructions and data 886 in a persistent state (e.g., the value is retained despite interruption of power to system 800). Storage 884 can be generically considered to be a "memory," although memory 830 is typically the executing or operating memory to provide instructions to processor 810. Whereas storage 884 is nonvolatile, memory 830 can include volatile memory (e.g., the value or state of the data is indeterminate if power is interrupted to system 800). In one example, storage subsystem 880 includes controller 882 to interface with storage 884. In one example controller 882 is a physical part of interface 814 or processor 810 or can include circuits or logic in both processor 810 and interface 814.

A volatile memory is memory whose state (and therefore the data stored in it) is indeterminate if power is interrupted to the device. Dynamic volatile memory requires refreshing the data stored in the device to maintain state. One example of dynamic volatile memory includes DRAM (Dynamic Random Access Memory), or some variant such as Synchronous DRAM (SDRAM). Another example of volatile memory includes a cache. A memory subsystem as described herein may be compatible with a number of memory technologies, such as DDR3 (Double Data Rate version 3, original release by JEDEC (Joint Electronic Device Engineering Council) on Jun. 27, 2007). DDR4 (DDR version 4, initial specification published in September 2012 by JEDEC), DDR4E (DDR version 4), LPDDR3 (Low Power DDR version3, JESD209-3B, August 2013 by JEDEC), LPDDR4) LPDDR version 4, JESD209-4, originally published by JEDEC in August 2014), WIO2 (Wide Input/output version 2, JESD229-2 originally published by JEDEC in August 2014, HBM (High Bandwidth Memory, JESD325, originally published by JEDEC in October 2013, LPDDR5 (currently in discussion by JEDEC), HBM2 (HBM version 2), currently in discussion by JEDEC, or others or combinations of memory technologies, and technologies based on derivatives or extensions of such specifications.

A non-volatile memory (NVM) device is a memory whose state is determinate even if power is interrupted to the device. In one embodiment, the NVM device can comprise a block addressable memory device, such as NAND technologies, or more specifically, multi-threshold level NAND flash memory (for example, Single-Level Cell ("SLC"), Multi-Level Cell ("MLC"), Quad-Level Cell ("QLC"), Tri-Level Cell ("TLC"), or some other NAND). A NVM device can also comprise a byte-addressable write-in-place three dimensional cross point memory device, or other byte addressable write-in-place NVM device (also referred to as persistent memory), such as single or multi-level Phase Change Memory (PCM) or phase change memory with a switch (PCMS), NVM devices that use chalcogenide phase change material (for example, chalcogenide glass), resistive memory including metal oxide base, oxygen vacancy base and Conductive Bridge Random Access Memory (CB-RAM), nanowire memory, ferroelectric random access memory (FeRAM, FRAM), magneto resistive random access memory (MRAM) that incorporates memristor technology, spin transfer torque (STT)-MRAM, a spintronic magnetic junction memory based device, a magnetic tunneling junction (MTJ) based device, a DW (Domain Wall) and SOT (Spin Orbit Transfer) based device, a thyristor based memory device, or a combination of any of the above, or other memory.

A power source (not depicted) provides power to the components of system 800. More specifically, power source typically interfaces to one or multiple power supplies in system 800 to provide power to the components of system 800. In one example, the power supply includes an AC to DC (alternating current to direct current) adapter to plug into a wall outlet. Such AC power can be renewable energy (e.g., solar power) power source. In one example, power source includes a DC power source, such as an external AC to DC converter. In one example, power source or power supply includes wireless charging hardware to charge via proximity to a charging field. In one example, power source can include an internal battery, alternating current supply, motion-based power supply, solar power supply, or fuel cell source.

In an example, system 800 can be implemented using interconnected compute sleds of processors, memories, storages, network interfaces, and other components. High speed interconnects can be used such as PCIe, Ethernet, or optical interconnects (or a combination thereof).

Embodiments herein may be implemented in various types of computing and networking equipment, such as switches, routers, racks, and blade servers such as those employed in a data center and/or server farm environment. The servers used in data centers and server farms comprise arrayed server configurations such as rack-based servers or blade servers. These servers are interconnected in communication via various network provisions, such as partitioning sets of servers into Local Area Networks (LANs) with appropriate switching and routing facilities between the LANs to form a private Intranet. For example, cloud hosting facilities may typically employ large data centers with a multitude of servers. A blade comprises a separate computing platform that is configured to perform server-type functions, that is, a "server on a card." Accordingly, each blade includes components common to conventional servers, including a main printed circuit board (main board) providing internal wiring (e.g., buses) for coupling appropriate integrated circuits (ICs) and other components mounted to the board.

Figure 9:
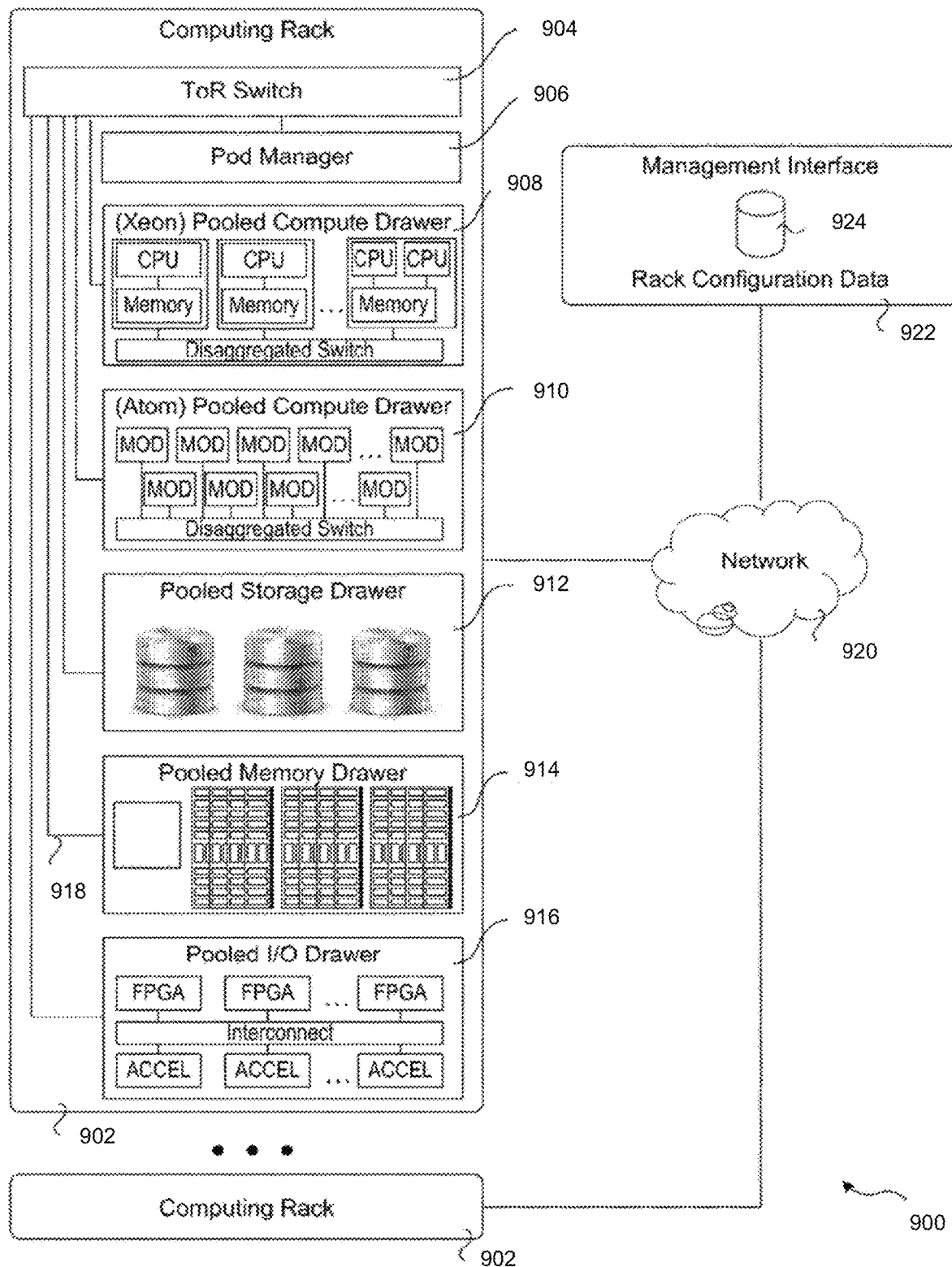
FIG. 9 depicts an example environment.

FIG. 9 depicts an environment 900 that includes multiple computing racks 902, each including a Top of Rack (ToR) switch 904, a pod manager 906, and a plurality of pooled system drawers. The environment can use embodiments described herein to encode data using techniques described herein. Generally, the pooled system drawers may include pooled compute drawers and pooled storage drawers. Optionally, the pooled system drawers may also include pooled memory drawers and pooled Input/Output (I/O) drawers. In the illustrated embodiment the pooled system drawers include an Intel® XEON® pooled computer drawer 908, and Intel® ATOM™ pooled compute drawer 910, a pooled storage drawer 912, a pooled memory drawer 914, and a pooled I/O drawer 916. Each of the pooled system drawers is connected to ToR switch 904 via a high-speed link 918, such as a 40 Gigabit/second (Gb/s) or 100 Gb/s Ethernet link or a 100+Gb/s Silicon Photonics (SiPh) optical link. In one embodiment high-speed link 918 comprises an 800 Gb/s SiPh optical link.

Multiple of the computing racks 902 may be interconnected via their ToR switches 904 (e.g., to a pod-level switch or data center switch), as illustrated by connections to a network 920. In some embodiments, groups of computing racks 902 are managed as separate pods via pod manager(s) 906. In one embodiment, a single pod manager is used to manage all of the racks in the pod. Alternatively, distributed pod managers may be used for pod management operations.

Environment 900 further includes a management interface 922 that is used to manage various aspects of the environment. This includes managing rack configuration, with corresponding parameters stored as rack configuration data 924.

Figure 10:
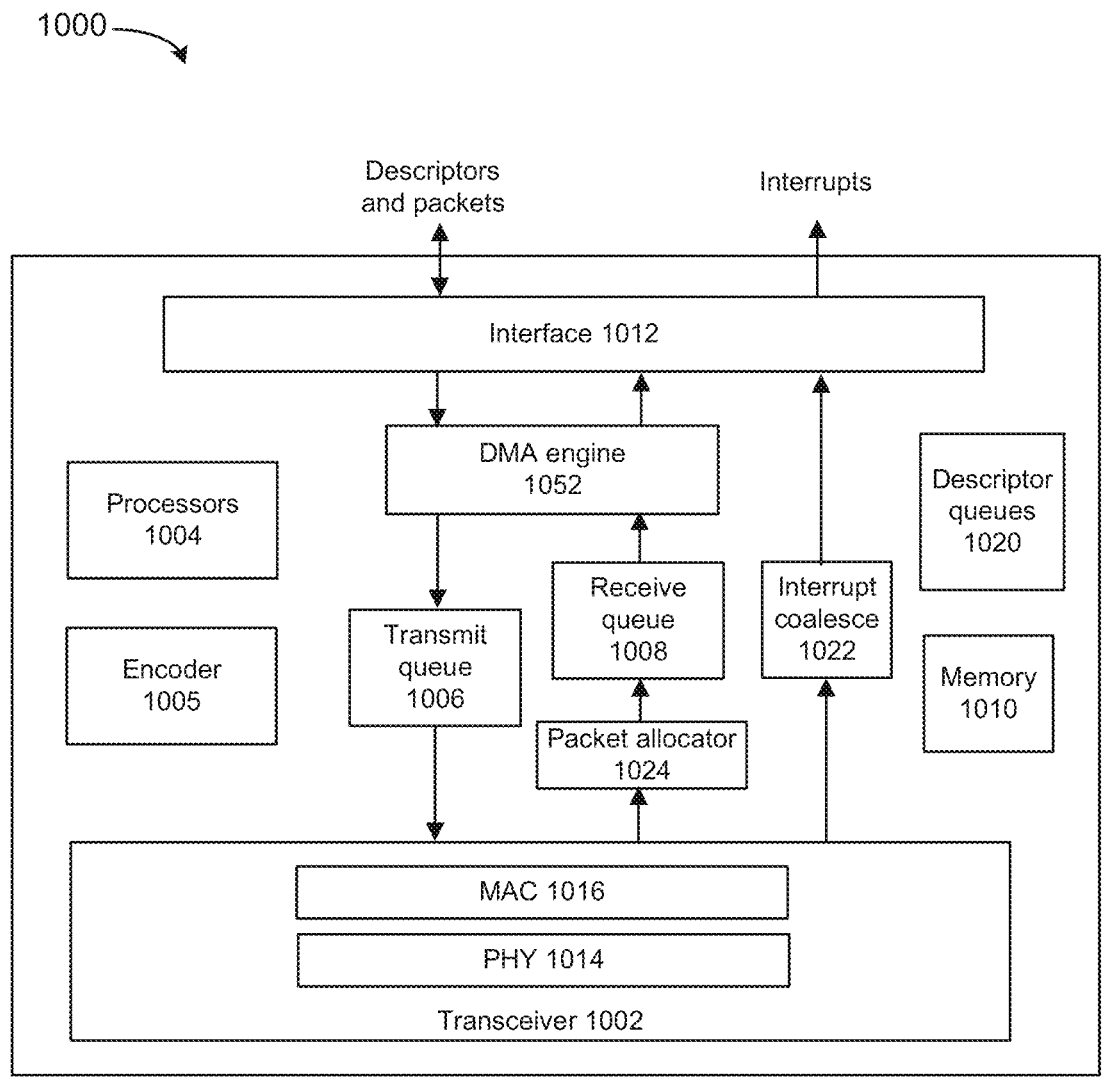
FIG. 10 depicts an example network interface.

FIG. 10 depicts a network interface that can use embodiments or be used by embodiments. Various embodiments described herein can be used to encode data in accordance with various embodiments described herein. In some examples, network interface 1000 can be implemented as a network interface controller, network interface card, a host fabric interface (HFI), host bus adapter (HBA). Network interface 1000 can be coupled to one or more servers using a bus, PCIe, CXL, or DDR. Network interface 1000 may be embodied as part of a system-on-a-chip (SoC) that includes one or more processors, or included on a multichip package that also contains one or more processors.

Network interface 1000 can include transceiver 1002, processors 1004, transmit queue 1006, receive queue 1008, memory 1010, and bus interface 1012, and DMA engine 1026. Transceiver 1002 can be capable of receiving and transmitting packets in conformance with the applicable protocols such as Ethernet as described in IEEE 802.3, although other protocols may be used. Transceiver 1002 can receive and transmit packets from and to a network via a network medium (not depicted). Transceiver 1002 can include physical layer (PHY) circuitry 1014 and media access control (MAC) circuitry 1016. PHY circuitry 1014 can include encoding and decoding circuitry (not shown) to encode and decode data packets according to applicable physical layer specifications or standards. MAC circuitry 1016 can be configured to assemble data to be transmitted into packets, that include destination and source addresses along with network control information and error detection hash values. MAC circuitry 1016 can be configured to process MAC headers of received packets by verifying data integrity, removing preambles and padding, and providing packet content for processing by higher layers.

Processors 1004 can be any a combination of a: processor, core, graphics processing unit (GPU), field programmable gate array (FPGA), application specific integrated circuit (ASIC), or other programmable hardware device that allow programming of network interface 1000. For example, processors 1004 can provide for allocation or deallocation of intermediate queues. For example, a "smart network interface" can provide packet processing capabilities in the network interface using processors 1004. In some examples, an encoder 1005 can be used to generate a NP of symbol occurrence in connection with compression of data in accordance with embodiments described herein.

Packet allocator 1024 can provide distribution of received packets for processing by multiple CPUs or cores using timeslot allocation described herein or RSS. When packet allocator 1024 uses RSS, packet allocator 1024 can calculate a hash or make another determination based on contents of a received packet to determine which CPU or core is to process a packet.

Interrupt coalesce 1022 can perform interrupt moderation whereby network interface interrupt coalesce 1022 waits for multiple packets to arrive, or for a time-out to expire, before generating an interrupt to host system to process received packet(s). Receive Segment Coalescing (RSC) can be performed by network interface 1000 whereby portions of incoming packets are combined into segments of a packet. Network interface 1000 provides this coalesced packet to an application.

Direct memory access (DMA) engine 1052 can copy a packet header, packet payload, and/or descriptor directly from host memory to the network interface or vice versa, instead of copying the packet to an intermediate buffer at the host and then using another copy operation from the intermediate buffer to the destination buffer. In some examples, DMA engine 1052 can perform writes of data to any cache such as by using Data Direct I/O (DDIO).

Memory 1010 can be any type of volatile or non-volatile memory device and can store any queue or instructions used to program network interface 1000. Transmit queue 1006 can include data or references to data for transmission by network interface. Receive queue 1008 can include data or references to data that was received by network interface from a network. Descriptor queues 1020 can include descriptors that reference data or packets in transmit queue 1006 or receive queue 1008. Bus interface 1012 can provide an interface with host device (not depicted). For example, bus interface 1012 can be compatible with peripheral connect Peripheral Component Interconnect (PCI), PCI Express, PCI-x, Serial ATA (SATA), and/or Universal Serial Bus (USB) compatible interface (although other interconnection standards may be used).

In some examples, network interface and other embodiments described herein can be used in connection with a base station (e.g., 3G, 4G, 5G and so forth), macro base station (e.g., 5G networks), picostation (e.g., an IEEE 802.11 compatible access point), nanostation (e.g., for Point-to-MultiPoint (PtMP) applications), on-premises data centers, off-premises data centers, edge network elements, fog network elements, and/or hybrid data centers (e.g., data center that use virtualization, cloud and software-defined networking to deliver application workloads across physical data centers and distributed multi-cloud environments).

Various examples may be implemented using hardware elements, software elements, or a combination of both. In some examples, hardware elements may include devices, components, processors, microprocessors, circuits, circuit elements (e.g., transistors, resistors, capacitors, inductors, and so forth), integrated circuits, ASICs, PLDs, DSPs, FPGAs, memory units, logic gates, registers, semiconductor device, chips, microchips, chip sets, and so forth. In some examples, software elements may include software components, programs, applications, computer programs, application programs, system programs, machine programs, operating system software, middleware, firmware, software modules, routines, subroutines, functions, methods, procedures, software interfaces, APIs, instruction sets, computing code, computer code, code segments, computer code segments, words, values, symbols, or any combination thereof. Determining whether an example is implemented using hardware elements and/or software elements may vary in accordance with any number of factors, such as desired computational rate, power levels, heat tolerances, processing cycle budget, input data rates, output data rates, memory resources, data bus speeds and other design or performance constraints, as desired for a given implementation. A processor can be one or more combination of a hardware state machine, digital control logic, central processing unit, or any hardware, firmware and/or software elements.

Some examples may be implemented using or as an article of manufacture or at least one computer-readable medium. A computer-readable medium may include a non-transitory storage medium to store logic. In some examples, the non-transitory storage medium may include one or more types of computer-readable storage media capable of storing electronic data, including volatile memory or non-volatile memory, removable or non-removable memory, erasable or non-erasable memory, writeable or re-writeable memory, and so forth. In some examples, the logic may include various software elements, such as software components, programs, applications, computer programs, application programs, system programs, machine programs, operating system software, middleware, firmware, software modules, routines, subroutines, functions, methods, procedures, software interfaces, API, instruction sets, computing code, computer code, code segments, computer code segments, words, values, symbols, or any combination thereof.

According to some examples, a computer-readable medium may include a non-transitory storage medium to store or maintain instructions that when executed by a machine, computing device or system, cause the machine, computing device or system to perform methods and/or operations in accordance with the described examples. The instructions may include any suitable type of code, such as source code, compiled code, interpreted code, executable code, static code, dynamic code, and the like. The instructions may be implemented according to a predefined computer language, manner or syntax, for instructing a machine, computing device or system to perform a certain function. The instructions may be implemented using any suitable high-level, low-level, object-oriented, visual, compiled and/or interpreted programming language.

One or more aspects of at least one example may be implemented by representative instructions stored on at least one machine-readable medium which represents various logic within the processor, which when read by a machine, computing device or system causes the machine, computing device or system to fabricate logic to perform the techniques described herein. Such representations, known as "IP cores" may be stored on a tangible, machine readable medium and supplied to various customers or manufacturing facilities to load into the fabrication machines that actually make the logic or processor.

The appearances of the phrase "one example" or "an example" are not necessarily all referring to the same example or embodiment. Any aspect described herein can be combined with any other aspect or similar aspect described herein, regardless of whether the aspects are described with respect to the same figure or element. Division, omission or inclusion of block functions depicted in the accompanying figures does not infer that the hardware components, circuits, software and/or elements for implementing these functions would necessarily be divided, omitted, or included in embodiments.

Some examples may be described using the expression "coupled" and "connected" along with their derivatives. These terms are not necessarily intended as synonyms for each other. For example, descriptions using the terms "connected" and/or "coupled" may indicate that two or more elements are in direct physical or electrical contact with each other. The term "coupled," however, may also mean that two or more elements are not in direct contact with each other, but yet still co-operate or interact with each other.

The terms "first," "second," and the like, herein do not denote any order, quantity, or importance, but rather are used to distinguish one element from another. The terms "a" and "an" herein do not denote a limitation of quantity, but rather denote the presence of at least one of the referenced items. The term "asserted" used herein with reference to a signal denote a state of the signal, in which the signal is active, and which can be achieved by applying any logic level either logic 0 or logic 1 to the signal. The terms "follow" or "after" can refer to immediately following or following after some other event or events. Other sequences of steps may also be performed according to alternative embodiments. Furthermore, additional steps may be added or removed depending on the particular applications. Any combination of changes can be used and one of ordinary skill in the art with the benefit of this disclosure would understand the many variations, modifications, and alternative embodiments thereof.

Disjunctive language such as the phrase "at least one of X, Y, or Z," unless specifically stated otherwise, is otherwise understood within the context as used in general to present that an item, term, etc., may be either X, Y, or Z, or any combination thereof (e.g., X, Y, and/or Z). Thus, such disjunctive language is not generally intended to, and should not, imply that certain embodiments require at least one of X, at least one of Y, or at least one of Z to each be present. Additionally, conjunctive language such as the phrase "at least one of X, Y, and Z," unless specifically stated otherwise, should also be understood to mean X, Y, Z, or any combination thereof, including "X, Y, and/or Z.'"

Illustrative examples of the devices, systems, and methods disclosed herein are provided below. An embodiment of the devices, systems, and methods may include any one or more, and any combination of, the examples described below.

Example 1 includes any example and includes an apparatus comprising: a central processing unit (CPU); and an encoding accelerator coupled to the CPU, the encoding accelerator comprising: an entropy encoder to determine normalized probability of occurrence of a symbol in a set of characters using a normalized probability approximation circuitry, wherein the normalized probability approximation circuitry is to output the normalized probability of occurrence of a symbol in a set of characters for lossless compression.

Example 2 includes any example, wherein the normalized probability approximation circuitry comprises one or more devices including a set including a shifter, adder, subtractor, or a comparator.

Example 3 includes any example, wherein the normalized probability approximation circuitry is to determine normalized probability by performance of non-power of 2 division without computation by a Floating Point Unit (FPU).

Example 4 includes any example, wherein to determine normalized probability of occurrence of a symbol in a set of characters, the normalized probability approximation circuitry is to round the normalized probability to a decimal.

Example 5 includes any example, wherein the normalized probability of occurrence of a symbol in a set of characters comprises a normalized probability of occurrence of (1) a number of literal length symbols; (2) a number of match length symbols; and (3) a number of match offset symbols.

Example 6 includes any example, wherein the set of characters are part of an LZ77 stream, LZ78 stream, LZ4 stream, or LZ4s stream.

Example 7 includes any example, wherein the entropy encoder is to generate finite state entropy (FSE) tables for the set of characters based on the normalized probability of occurrence of a symbol.

Example 8 includes any example, wherein the entropy encoder is to determine normalized probability of occurrence of a symbol in a manner compatible with Internet Engineering Task Force (IETF) RFC 8478 "Zstandard Compression and the application/zstd Media Type" (October 2018).

Example 9 includes any example, wherein the normalized probability approximation circuitry is part of a central processing unit (CPU) or a separate chip coupled to the CPU.

Example 10 includes any example, and includes: a server comprising a central processing unit (CPU) and a network interface, the CPU or network interface to generate compressed data based on the normalized probability and network interface to transmit the compressed data.

Example 11 includes any example, and includes a method comprising: determining normalized probability of occurrence of a symbol in a set of characters using a normalized probability approximation circuitry; generating finite state entropy (FSE) tables for the set of characters based on the normalized probability of occurrence of the symbol; and encoding a stream of characters based on the FSE tables.

Example 12 includes any example, wherein the normalized probability approximation circuitry comprises one or more devices including a set including a shifter, adder, subtractor, or a comparator.

Example 13 includes any example, wherein the determining normalized probability of occurrence of a symbol in a set of characters comprises determining normalized probability of occurrence of a symbol in a set of characters without determining normalized probability of occurrence of a symbol in a set of characters by a Floating Point Unit (FPU).

Example 14 includes any example, wherein the determining normalized probability of occurrence of a symbol in a set of characters comprises determining a normalized probability of occurrence of (1) a number of literal length symbols; (2) a number of match length symbols; and (3) a number of match offset symbols.

Example 15 includes any example, wherein the set of characters are part of an LZ77 stream, LZ78 stream, LZ4 stream, or LZ4s stream.

Example 16 includes any example, and includes: determining normalized probability of occurrence of a symbol in a manner compatible with Internet Engineering Task Force (IETF) RFC 8478 "Zstandard Compression and the application/zstd Media Type" (October 2018).

Example 17 includes any example, and includes a non-transitory computer-readable medium, comprising instructions stored thereon, that if executed by one or more processors, cause the one or more processors to: determine normalized probability of occurrence of a symbol in a set of characters by commanding one or more arithmetic logic units (ALUs) to determine an approximate normalized probability.

Example 18 includes any example, wherein: determine normalized probability of occurrence of a symbol in a set of characters by commanding one or more arithmetic logic units (ALUs) to determine an approximate normalized probability comprises determine normalized probability of occurrence of a symbol in a set of characters without determine normalized probability of occurrence of a symbol in a set of characters by a Floating Point Unit (FPU).

Example 19 includes any example, wherein the normalized probability of occurrence of a symbol in a set of characters comprises a normalized probability of occurrence of (1) a number of literal length symbols; (2) a number of match length symbols; and (3) a number of match offset symbols.

Example 20 includes any example, and includes instructions stored thereon, that if executed by one or more processors, cause the one or more processors to: generate finite state entropy (FSE) tables for the set of characters based on the normalized probability of occurrence of the symbol; and encode a stream of characters based on the FSE tables.

What is claimed is:

1. An apparatus comprising:
a central processing unit (CPU); and
an encoding accelerator coupled to the CPU, the encoding accelerator comprising:
an entropy encoder to determine normalized probability of occurrence of a symbol in a set of characters using a normalized probability approximation circuitry and to generate finite state entropy (FSE) tables for the set of characters based on the determined normalized probability of occurrence of the symbol, wherein to determine the normalized probability of occurrence of the symbol in the set of characters, the entropy encoder is to determine the normalized probability of occurrence of the symbol in the set of characters without determination of normalized probability of occurrence of the symbol in the set of characters by a Floating Point Unit (FPU), and
based on the FSE tables, perform lossless compression on data.

2. The apparatus of claim 1, wherein the normalized probability approximation circuitry comprises one or more devices including at least one of: a shifter, adder, subtractor, or a comparator.

3. The apparatus of claim 1, wherein the normalized probability approximation circuitry is to determine normalized probability by performance of non-power of 2 division without computation by the FPU.

4. The apparatus of claim 1, wherein to determine normalized probability of occurrence of the symbol in the set of characters, the normalized probability approximation circuitry is to round the normalized probability to a decimal.

5. The apparatus of claim 1, wherein the normalized probability of occurrence of the symbol in the set of characters comprises a normalized probability of occurrence of (1) a number of literal length symbols; (2) a number of match length symbols; and (3) a number of match offset symbols.

6. The apparatus of claim 1, wherein the set of characters are part of an LZ77 stream, LZ78 stream, LZ4 stream, or LZ4s stream.

7. The apparatus of claim 1, wherein the entropy encoder is to generate finite state entropy (FSE) tables for the set of characters based on the normalized probability of occurrence of a symbol.

8. The apparatus of claim 1, wherein the entropy encoder is to determine normalized probability of occurrence of the symbol in a manner compatible with Internet Engineering Task Force (IETF) RFC 8478 "Zstandard Compression and the application/zstd Media Type" (October 2018).

9. The apparatus of claim 1, wherein the normalized probability approximation circuitry is part of the CPU or a separate chip coupled to the CPU.

10. The apparatus of claim 1, comprising:
a server comprising the CPU and a network interface, the CPU or network interface to generate the compressed data based on the normalized probability and the network interface to transmit the compressed data.

11. A method comprising:
determining normalized probability of occurrence of a symbol in a set of characters using a normalized probability approximation circuitry, wherein the determining normalized probability of occurrence of the symbol in the set of characters comprises determining normalized probability of occurrence of the symbol in the set of characters without determining normalized probability of occurrence of the symbol in the set of characters by a Floating Point Unit (FPU);
generating finite state entropy (FSE) tables for the set of characters based on the normalized probability of occurrence of the symbol; and
encoding a stream of characters based on the FSE tables.

12. The method of claim 11, wherein the normalized probability approximation circuitry comprises at least one or more of: a shifter, adder, subtractor, or a comparator.

13. The method of claim 11, wherein the determining normalized probability of occurrence of the symbol in the set of characters comprises determining a normalized probability of occurrence of (1) a number of literal length symbols; (2) a number of match length symbols; and (3) a number of match offset symbols.

14. The method of claim 11, wherein the set of characters are part of an LZ77 stream, LZ78 stream, LZ4 stream, or LZ4s stream.

15. The method of claim 11, comprising:
determining normalized probability of occurrence of the symbol in a manner compatible with Internet Engineering Task Force (IETF) RFC 8478 "Zstandard Compression and the application/zstd Media Type" (October 2018).

16. A non-transitory computer-readable medium, comprising instructions stored thereon, that if executed by one or more processors, cause the one or more processors to:
determine normalized probability of occurrence of a symbol in a set of characters by commanding one or more arithmetic logic units (ALUs) to determine an approximate normalized probability;
generate finite state entropy (FSE) tables for the set of characters based on the determined normalized probability of occurrence of the symbol; and
encode a stream of characters based on the FSE tables.

17. The non-transitory computer-readable medium of claim 16, wherein:
determine normalized probability of occurrence of the symbol in the set of characters by commanding one or more arithmetic logic units (ALUs) to determine the approximate normalized probability comprises determine normalized probability of occurrence of the symbol in the set of characters without determine normalized probability of occurrence of the symbol in the set of characters by a Floating Point Unit (FPU).

18. The non-transitory computer-readable medium of claim 16, wherein the normalized probability of occurrence of the symbol in the set of characters comprises a normalized probability of occurrence of (1) a number of literal length symbols; (2) a number of match length symbols; and (3) a number of match offset symbols.

* * * * *